United States Patent
Yoneda et al.

[19]

[11] Patent Number: 6,165,907
[45] Date of Patent: Dec. 26, 2000

[54] PLASMA ETCHING METHOD AND PLASMA ETCHING APPARATUS

[75] Inventors: Ikuo Yoneda, Kawasaki; Hideki Kanai; Shinichi Ito, both of Yokohama, all of Japan

[73] Assignee: Kabushiki Kaisha Toshiba, Kawasaki, Japan

[21] Appl. No.: 08/850,700

[22] Filed: May 2, 1997

[30] Foreign Application Priority Data

May 20, 1996 [JP] Japan ................................. 8-124650
Jul. 5, 1996 [JP] Japan ................................. 8-176441

[51] Int. Cl.⁷ ....................... H01L 21/302; H01L 21/461
[52] U.S. Cl. .................. 438/706; 438/717; 438/729; 215/13
[58] Field of Search .................... 438/717, 706, 438/700, 710, 729, 719; 215/12, 13; 430/5, 312, 313

[56] References Cited

U.S. PATENT DOCUMENTS

| | | | |
|---|---|---|---|
| 4,201,800 | 5/1980 | Alcorn et al. | 438/717 |
| 5,225,035 | 7/1993 | Rolfson | 156/643 |
| 5,302,477 | 4/1994 | Dao et al. | 430/5 |
| 5,320,934 | 6/1994 | Misium et al. | 216/13 |
| 5,413,966 | 5/1995 | Schoenborn | 438/717 |
| 5,478,678 | 12/1995 | Yang et al. | 430/5 |
| 5,536,603 | 7/1996 | Tsuchiya et al. | 216/12 |
| 5,792,376 | 8/1998 | Kanai et al. | 438/729 |

FOREIGN PATENT DOCUMENTS

| | | |
|---|---|---|
| 5-82477 | 4/1993 | Japan . |
| 5-265180 | 10/1993 | Japan . |
| 6-10140 | 1/1994 | Japan . |
| 2506389 | 4/1996 | Japan . |

*Primary Examiner*—Benjamin L. Utech
*Assistant Examiner*—Duy-Vu Deo
*Attorney, Agent, or Firm*—Oblon, Spivak, McClelland, Maier & Neustadt, P.C.

[57] ABSTRACT

A plasma etching method includes the steps of forming an etching mask on a work piece, forming a patterned film, made of a material having an etching rate of 80% or more to 120% or less based on an etching rate for the work piece, on the work piece having the etching mask thereon, and etching the work piece and the patterned film formed thereon at the same time by use of a reactive gas plasma, wherein the film is formed with such a thickness that the thickness of a remaining portion of the film is equal to zero or more after the work piece is etched to a desired depth.

4 Claims, 15 Drawing Sheets

F I G. 12A
F I G. 12B
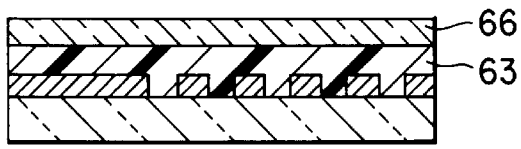
F I G. 12C
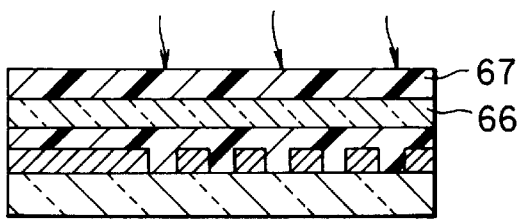
F I G. 12D
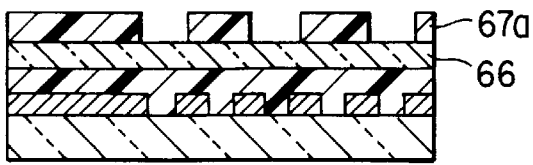
F I G. 12E
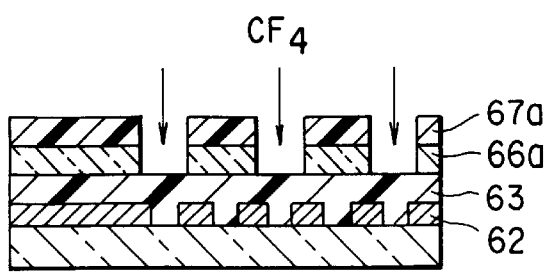
F I G. 12F
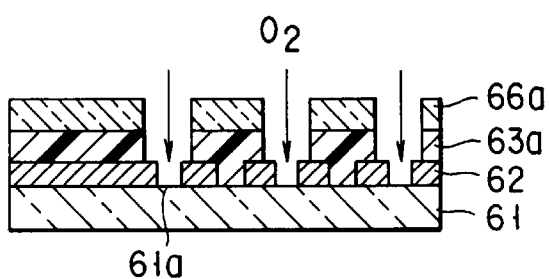
F I G. 12G
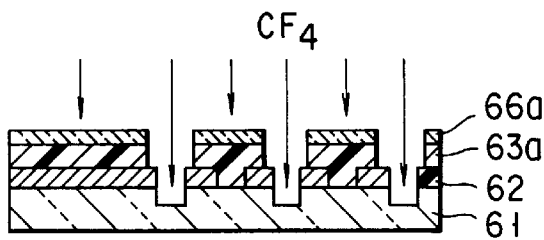
F I G. 12H
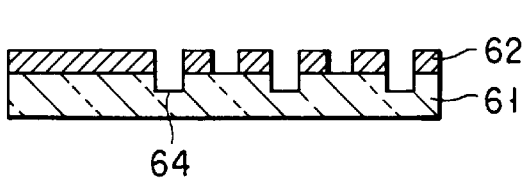
F I G. 12I

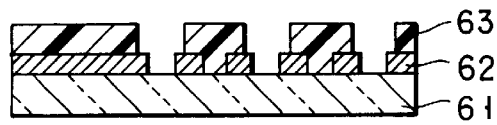
F I G. 13A
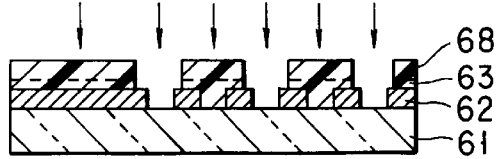
F I G. 13B
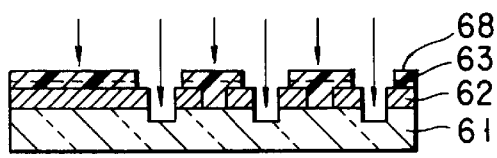
F I G. 13C
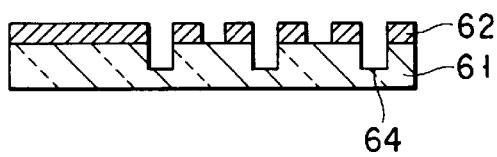
F I G. 13D
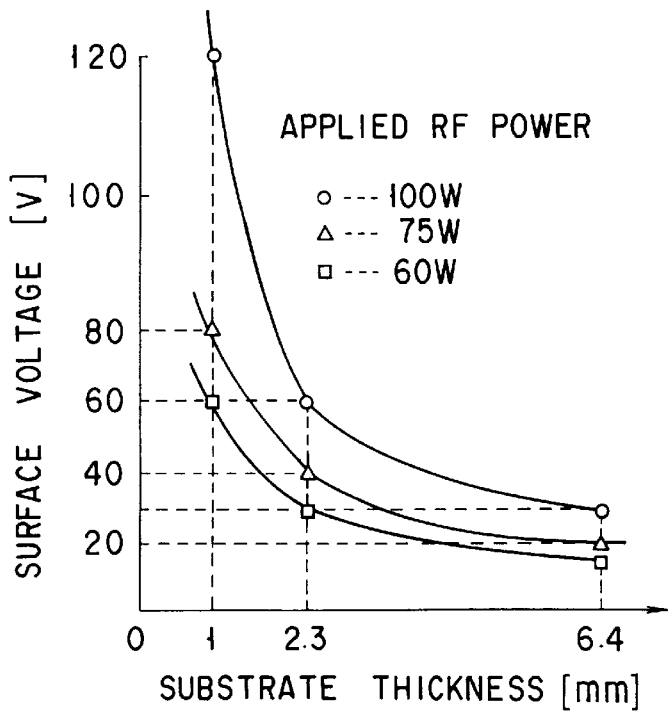
F I G. 14

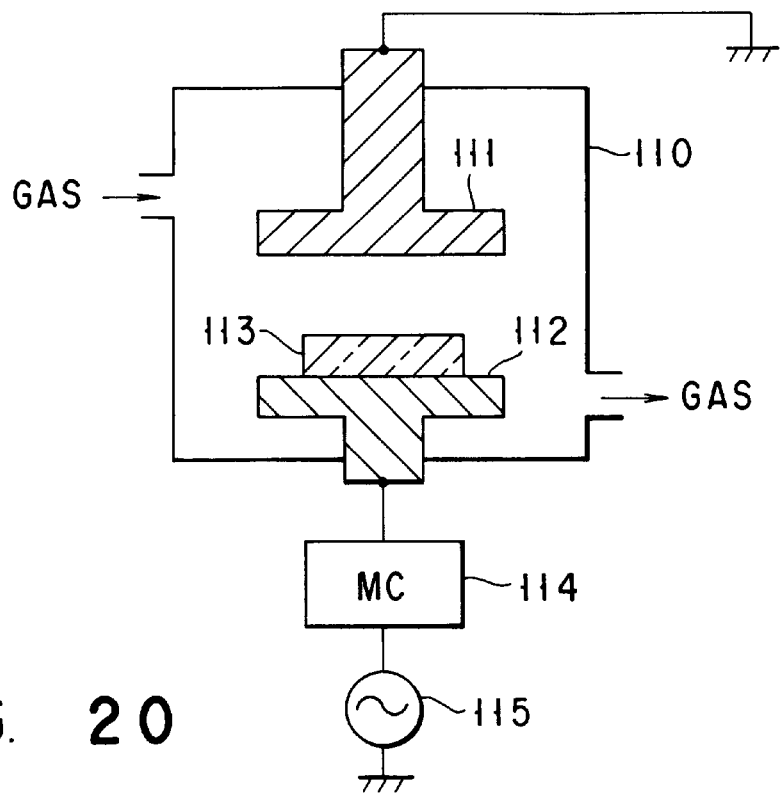
F I G. 20
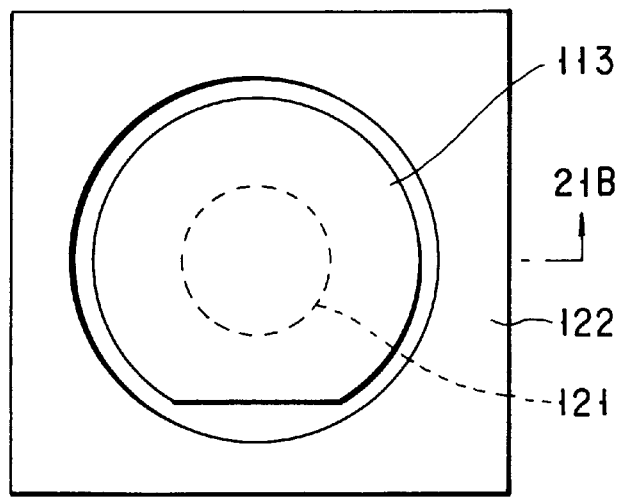
F I G. 21A
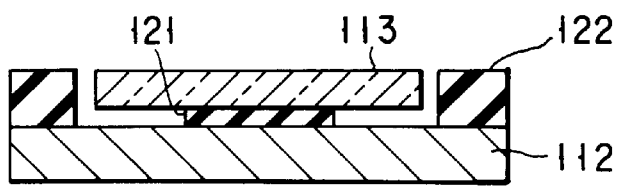
F I G. 21B

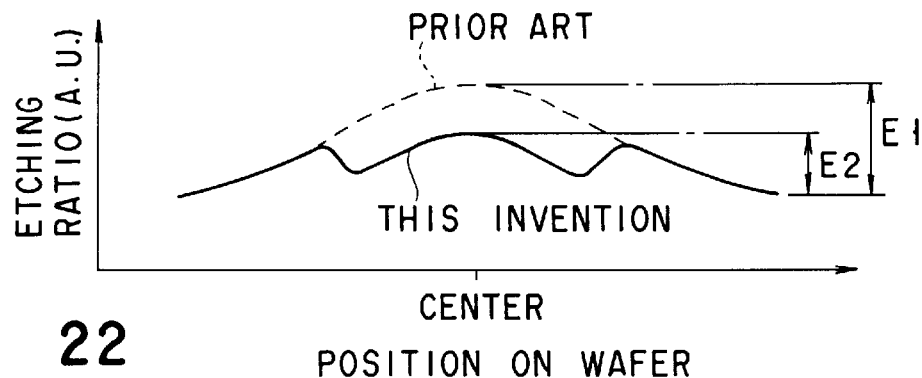
F I G. 22
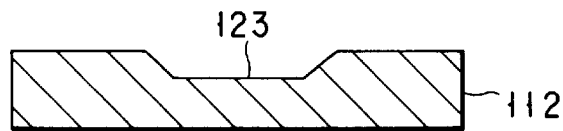
F I G. 23A
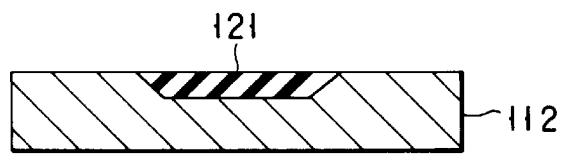
F I G. 23B
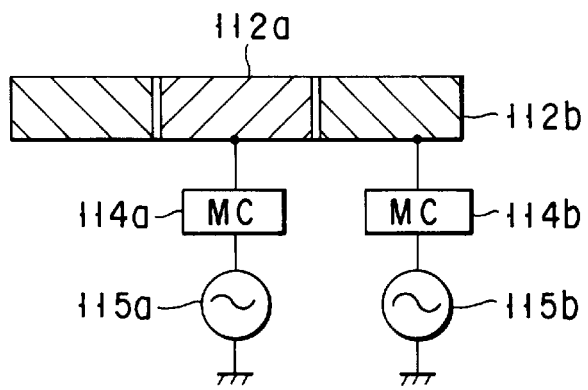
F I G. 23C

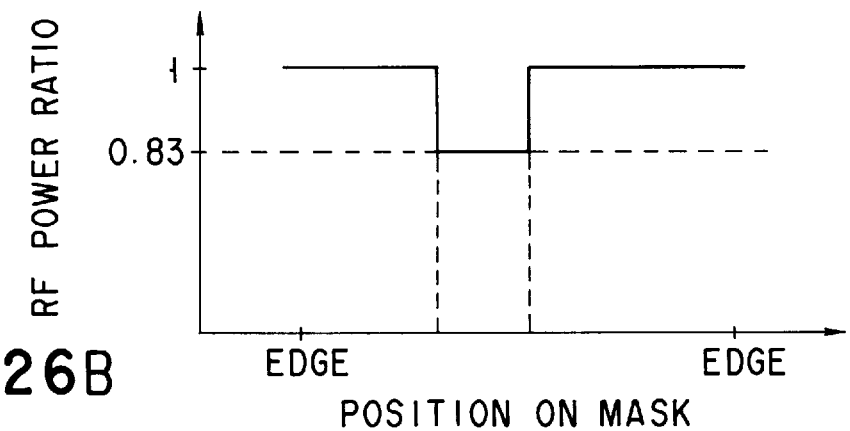
F I G. 26B
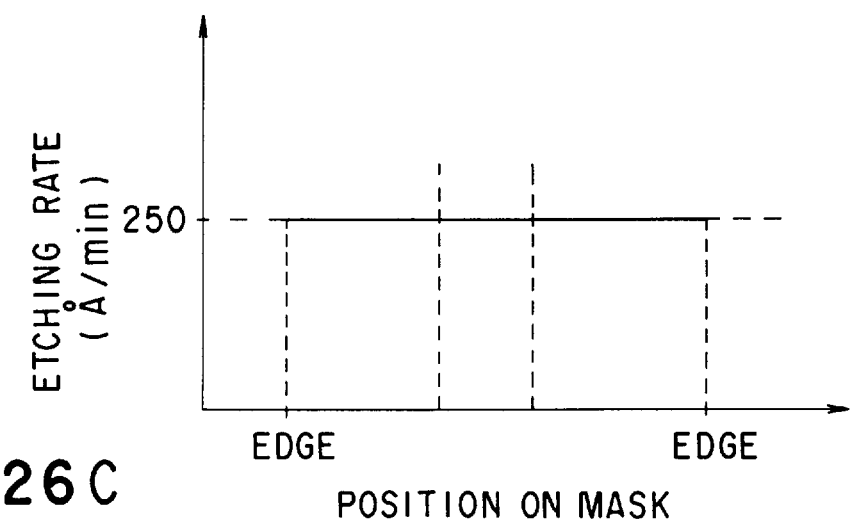
F I G. 26C

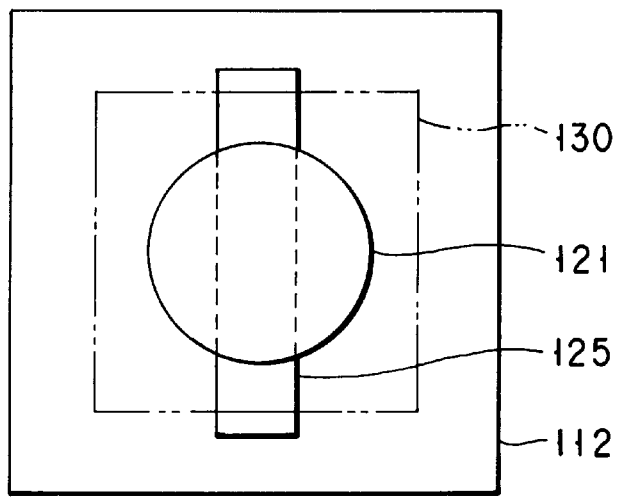
F I G. 27
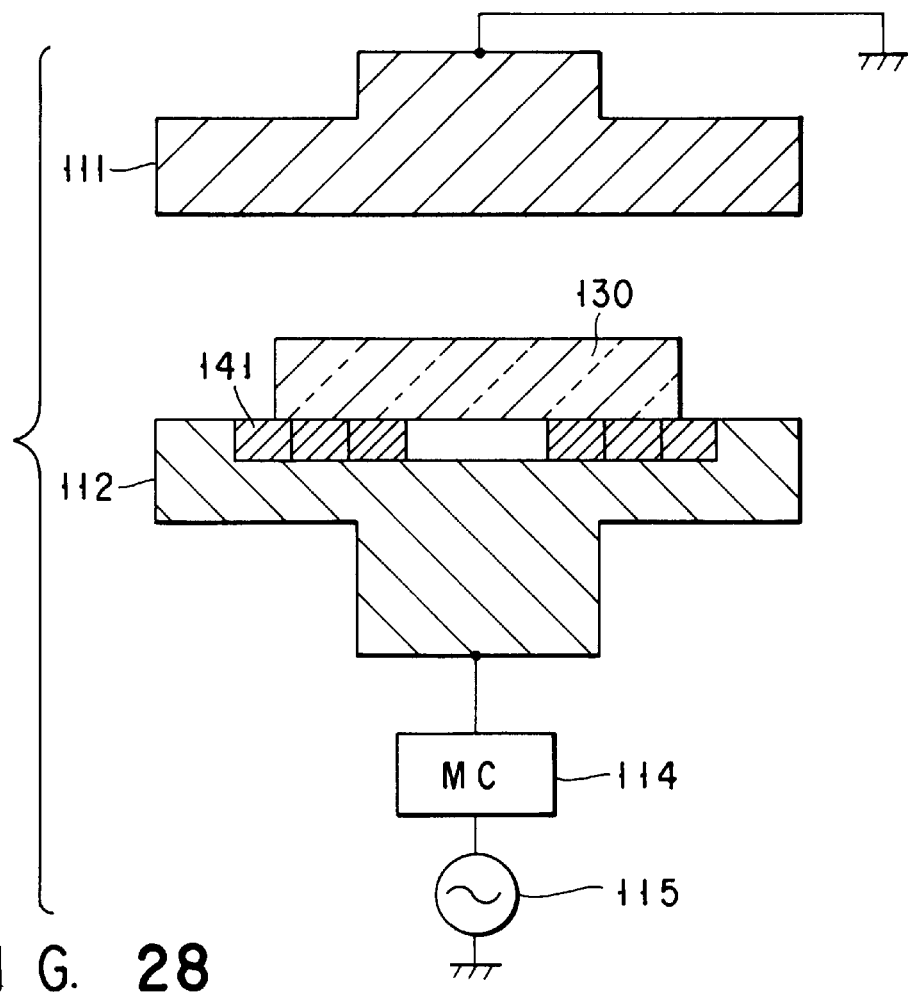
F I G. 28

PLASMA ETCHING METHOD AND PLASMA ETCHING APPARATUS

BACKGROUND OF THE INVENTION

The present invention relates to a lithography technique, more specifically, to a plasma etching method for use in the field of manufacturing semiconductor devices. The invention also relates to a method of manufacturing a photomask with a phase-shift pattern formed by the plasma etching method and to a plasma etching apparatus for use in manufacturing the photomask.

Recently, further development of miniaturization techniques for processing highly integrated semiconductor devices has been strongly desired. Under these circumstances, many trials have been made to improve a photomask and an optical system of a stepper, with the intention of increasing pattern resolution and depth of focus for the exposure light.

As one of these trials concerning the photomask, a phase shifting mask has been developed which has phase shifters selectively arranged on the surface of a mask pattern. An optical image partially inverted by the phase shifter and arranged next to a non-inverting portion. Therefore, the resolution and the depth of focus of an optical image can be improved. As such a phase shifting mask, an alternated phase shifting mask, half-tone mask, shifter-edge-mask, and self-aligning mask have been reported. Of these phase shifting masks, the alternated phase shifting mask (disclosed by M. D. Levenson et al.) is the most effectively improved in resolving power and depth of focus.

As known well, the alternated phase shifting mask, comprises a transparent substrate and an opaque film provided on the transparent substrate. The opaque film has a plurality of openings over which the phase shifters are alternately provided. Light transmitted through the phase shifter is phase-inverted relative to the light transmitted through the opening with no phase shifter. The phase shifter used herein is formed by providing a shifter material such as SOG (spin-on-glass) to a mask having an opaque film pattern provided thereon (made of Cr etc.) to a thickness d, and patterning the resultant film. The thickness d is defined by the wavelength of exposure light as shown in the following equation:

$$d = \lambda/2(n-1)$$

where n is the refractive index of a shifter material and $\lambda$ is the wavelength of exposure light.

The structure of the phase shifter thus obtained is known as an additive shifter type.

However, the phase shifting mask of the additive shifter type has the following problems. Since an additional step for forming the shifter material is required, the manufacturing process is complicated. In addition, a phase shifter is easily removed during a washing step of the mask depending the properties for the shifter material. If the phase shifter and the mask substrate differ in refractive index, exposure light is reflected at the interface between them, degrading an optical image including resolution and a depth of focus.

There is another type of the alternated phase shifting mask called "subtractive shifter type" (Jpn. Pat. Appln. KOKAI Publication No. 62-189468). In this type of the photomask, the phase shifter is formed by etching a mask substrate made of quartz to the thickness d defined above. To be more specific, a mask is first prepared by providing an opaque film pattern (Cr etc.) on a transparent substrate (quartz etc.). Then, a resist pattern is provided over alternate openings (light-transmitting portion) of the opaque film. Thereafter, the substrate is etched by RIE (Reactive Ion Etching) etc. using the resist pattern as a mask, thereby preparing a phase shifter. After the resist is removed, the alternated phase shifting mask of a subtractive shifter type is obtained.

In the shifter-edge type mask, openings are formed on a transparent substrate by using a resist pattern instead of the opaque film. After the substrate exposed in the openings is etched by RIE etc., the resist is removed, thereby forming the shifter-edge type mask.

Furthermore, a phase shifting mask of a dual trench shifter type has been developed as another type of the subtractive shifter mask. The dual trench shifter mask is formed by etching alternate openings followed by etching the entire surface of a light transmitting portion (quartz substrate) of the mask uniformly.

As described above, in the conventional phase shifting mask of the subtractive shifter type, to form a phase shifter, a resist pattern of the shifter portion is written and developed in a single step, and thereafter the engraving (subtracting) portion is uniformly etched by use of an etching apparatus, or thereafter the resist is removed and the entire surface of the mask is etched.

However, it is very difficult to obtain the same etching depth in all shifter patterns since the etching rate varies depending on the etching sites by the reasons intrinsic to the etching apparatus and varies depending on the dimensions of the opening of the pattern to be etched (the microloading effect).

To describe more specifically, in the RIE etching apparatus using a plasma generated between parallel plate electrodes, there is a problem caused by the factors intrinsic to the apparatus, such as the electrode structure, plasma generation method, and processing conditions. That is, an etching rate of the center potion of a work piece (which is a member to be etched) closer to the electrode is higher or lower than the peripheral portion thereof. There is another problem with the etching rate as depicted in FIG. 1 which shows the relationship between the pattern size of the work piece and the etching rate (relative value). That is, the etching rate decreases, as the pattern size becomes smaller.

To increase the depth of focus by improving a resolution of an optical image by use of phase-inversion, the shifting amount shifted by the phase shifter must be close to 180°. If the phase is shifted more than or less than the desired value (180°), the intensity of light transmitted through adjacent openings differs at the time of defocusing, as shown in FIGS. 2A and 2B (phase shift: 170°). In FIG. 2B, the position on a mask corresponds to the lateral position of the mask shown in the cross sectional view of FIG. 2A. In FIG. 2A, reference numeral 1 denotes a transparent substrate, reference numerals 2 and 3 indicate a subtractive shifter portion and a non-shifter portion, respectively, and reference numeral 4 represents an opaque film.

In the case where a light exposure apparatus has a focus error or in the case where a stepped portion present in the surface of a substrate, the pattern cannot be formed with an accurate dimensions, deteriorating properties of a semiconductor device. The phase shifting amount is principally proportional to the etching depth d of the substrate. It is therefore necessary to control the etching depth accurately in such a way that the etching is performed at a nearly desired value in the step of manufacturing a light-exposure mask.

To sum up, to control the etching depth highly precisely in the light-exposure mask having the phase shifter, it is necessary to reduce non-uniformity in etching rate which varies depending on etching sites and to reduce variation in etching amount (etching depth) due to the microloading effect.

In the etching apparatus, the difference in etching rate between the center portion and the peripheral portion of the substrate mounted on an electrode leads to the difference in etching depth between the central portion and the peripheral portion of the semiconductor wafer, decreasing the reliability of the semiconductor device.

BRIEF SUMMARY OF THE INVENTION

The present invention has been made in view of the aforementioned problems. An object of the present invention is to provide a plasma etching method and apparatus for improving the uniformity of the etching rates of the surface of a work piece (member to be etched) and for improving the accuracy of the shape obtained by etching when a pattern is formed on the surface of the work piece by plasma etching. More specifically, the object of the present invention is to provide a plasma etching method and apparatus ensuring the uniformity of phase differences of phase shifters over the surface of a mask substrate when a phase shifting mask is formed.

To attain the aforementioned object, a plasma etching method according to a first aspect of the present invention preferably comprises the steps of:

forming an etching mask on a work piece;

forming a patterned film made of a material having an etching rate of 80% or more to 120% or less based on an etching rate for the work piece, on the work piece having the etching mask thereon; and etching the work piece and the patterned film formed thereon at the same time by use of a reactive gas plasma, wherein the step of forming a patterned film includes a step of forming the film with such a thickness that the thickness of a remaining portion of the film is equal zero to or more after the work piece is etched to a desired depth.

It is preferable that the film mentioned above be made of the same material as that of the work piece. More specifically, it is preferable that the work piece is made of a quartz glass and the film is made of Spin-On-Glass.

The step of forming a patterned film may include a step of chemically modifying a surface of the etching mask. To be more specific, the work piece may be made of quartz glass and the etching mask may be made of a photoresist and the step of forming a patterned film may include a step of sililating the surface of the photoresists.

The plasma etching method according to a second aspect of the present invention comprises the steps of:

forming a film made of a material selected from a group consisting of an opaque film, a translucent film, and a resist, on a surface of a transparent substrate;

etching the film selectively to expose part of the surface of the transparent substrate; and selectively etching the surface of the transparent substrate partially exposed by use of a reactive gas plasma after the transparent substrate is mounted on a stage to which an RF voltage is applied;

wherein a thickness of the transparent substrate is set so that the RF voltage transmitting through the transparent substrate has a transmittance of 80% or more.

It is preferable that the transparent substrate is made of quartz and have a thickness of 1 mm.

A method of manufacturing a photomask by use of the plasma etching method mentioned above comprises the steps of:

forming a film made of a material selected from a group consisting of an opaque film, translucent film and a resist on a surface of a transparent substrate;

selectively etching the film to expose part of the front surface of the transparent substrate;

selectively etching the front surface of the transparent substrate partially exposed by use of a reactive gas plasma after the transparent substrate is mounted on a stage to which an RF voltage is to be applied; a thickness of the transparent substrate being set so that the RF voltage transmitting through the transparent substrate has a trasmittance of 80% or more; and bonding a transparent supporting plate to a rear surface of the transparent substrate after the step of selectively etching the transparent substrate by use of the reactive gas plasma.

It is preferred that the transparent substrate be made of quartz and have a thickness of 1 mm.

The photomask obtained in the aforementioned manufacturing method comprises a quartz substrate of 1 mm or less in thickness having an opaque film selectively formed on a surface thereof and a transparent supporting substrate bonded on a rear surface of the quartz substrate.

A plasma etching method according to a third aspect of the present invention comprises the steps of:

mounting a work piece on a conductive stage to which an RF voltage is applied;

providing an insulating shield on the conductive stage around the work piece, a thickness of the work piece being set so that a transmittance of the RF voltage transmitting through the work piece falls in a range of 80% or more to 120% or less of the transmittance of the RF voltage transmitting through the insulating shield; and etching the surface of the work piece by use of a reactive gas plasma.

It is preferable that the work piece is made of a quartz glass and the insulating shield is made of alumina.

A plasma etching method according to a fourth aspect of the present invention comprises the steps of:

forming an etching mask on a work piece;

mounting the work piece on a stage divided into at least a center portion and a peripheral portion, to which RF voltages are applied, respectively; and selectively etching the work piece by anisotropical etching by use of a reactive gas plasma generated by the RF voltage;

wherein, in the step of etching, the RF voltages are respectively applied to the portions of the stage in a manner to equalize a potential distribution by the RF voltages over the work piece.

It is preferable that a corresponding one of the RF voltages applied to the peripheral portion of the stage is smaller than another of the RF voltages applied to the center portion in the step of etching.

Alternately, a corresponding one of the RF voltages applied to the center portion of the stage may be smaller than another of the RF voltages applied to the peripheral portion, if necessary in the step of etching.

A method of manufacturing a photomask by use of the aforementioned etching method comprises the steps of:

forming an etching mask on a transparent substrate;

mounting the transparent substrate on a plurality of divided stage portions, each of which an RF voltage is applied to; and forming a subtractive pattern by selectively etching the transparent substrate by anisotropical etching by use of a reactive gas plasma generated by the RF voltage;

wherein the step of forming a subtractive pattern includes a step of applying the RF voltage in a smaller value to one of the divided stage portions corresponding to a region of the substrate having a larger size pattern than to another one of the divided stage portions corresponding to a region of the substrate having a smaller size pattern.

The plasma etching apparatus attaining the aforementioned etching method comprises:

an electrode to which a work piece is to be mounted; the electrode being divided into a plurality of portions;

at least one RF voltage source for supplying an RF voltage to each of the plural portions of the electrode;

plasma generating means for generating a reactive gas plasma to be radiated to the work piece;

control means for controlling the RF voltage to be supplied to each of the plural portions of the electrode so as to provide an uniform potential to the surface of the work piece.

It is preferable that the control means control the RF voltage applied to the plural portions of the divided electrode so that the RF voltage in a smaller value is applied to a center portion of the plural portions of the electrode than a peripheral portion of the same.

Alternatively, the control means may control an RF voltage applied to the plural portions of the divided electrode so that the RF voltage in a smaller value is applied to a peripheral portion of the electrode than a center portion of the plural portions of the same, if necessary.

The control means may also control the RF voltage so that the RF voltage in a smaller value is applied to one of the plural portions corresponding to a larger size pattern than to another one of the plural portions corresponding to a smaller size pattern.

According to the fourth aspect of the present invention, difference in etching rate between the peripheral portion and the center portion of the electrode can be decreased by improving the electrode portion, for example, by employing a divided electrode structure. Due to this structure, even if a large wafer is used, it is possible to reduce the difference in etching depth between the peripheral portion and the center portion of the wafer. As a result, the reliability of the semiconductor device can be improved.

Furthermore, in the case of the light exposure mask, partial improvement of the electrode made it possible to apply a smaller RF power to the work piece portion with a large pattern size which is etched at a high rate, thereby controlling a distribution of RF power applied to a work piece. As a result, the uniformity of the etching depths for the phase shifter formation can be improved. In this manner, a mask can be formed with a high phase accuracy (with a small phase error) over the entire surface, with the result that the depth of focus and dimension accuracy of the light exposure pattern can be improved.

For example, by changing RF power distribution of the etching apparatus in consideration of the distribution of the etching rates ascribed to the factors intrinsic to a conventional electrode structure, the shifter error can be reduced from 9° to 4° in the case of 100 mm square area of a 6-inch square mask of 0.25-inch thick. In this manner, as a result that the phase accuracy is improved during the shifter etching, the depth of focus and dimensional accuracy of a light exposure image can be greatly improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a case where fine patterns are placed adjacent to a wide pattern, and FIG. 4 is the case where only fine patterns are placed;

FIG. 5A is a plan view showing a mask in which fine patterns and a wide pattern are copresent, FIGS. 5B and 5C are enlarged views of circles 5B and 5C, respectively, FIGS. 5D and 5E are cross sectional views taken along the 5D—5D line and the 5E—5E line of FIG. 5B and FIG. 5C, respectively;

FIG. 11A is a cross sectional view of a mask substrate, and FIG. 11B shows the surface voltage corresponding to lateral position of FIG. 11A;

FIGS. 12A to 12I are cross sectional views showing the manufacturing steps of the photomask in succession by use of the plasma etching method, according to Embodiment 1 of the present invention;

FIGS. 13A to 13D are cross sectional views showing the manufacturing steps of the photomask in succession by use of the plasma etching method according to Embodiment 2 of the present invention;

FIG. 14 is a graph showing the relationship between the thickness of a quartz substrate and a surface voltage;

FIG. 20 is a schematic view showing the structure of a dry etching apparatus according to Embodiment 5 of the present invention;

FIG. 21A is a plan view showing the structure of a lower electrode according to Embodiment 5;

FIG. 21B is a cross sectional view taken along the 21B to 21B line of FIG. 21A;

FIG. 22 is a diagram showing a change in etching rate relative to position on a wafer etched by the apparatus according to Embodiment 5, compared to that by a conventional apparatus;

FIGS. 23A to 23C are cross sectional views showing the structure of the dry etching device according to Embodiment 6 of the present invention, FIG. 23A is a case in which a recess portion is provided in the surface of the electrode, FIG. 23B is the case in which an RF attenuation plate is placed in the recess portion, and FIG. 23C is the case in which an electrode is divided;

FIG. 26B is a diagram showing the relationship between the RF power versus position on a mask substrate of Embodiment 7 on the basis of the RF power of the end portion of a substrate;

FIG. 26C is a diagram showing a change in etching rate relative to position on a mask substrate of Embodiment 7;

FIG. 27 is a plan view of a lower electrode in which two types of high-frequency attenuation plates are used in place of the RF attenuation plate of Embodiment 7;

FIG. 28 is a cross sectional view of an electrode structure of a plasma etching apparatus according to Embodiment 8 of the present invention;

DETAILED DESCRIPTION OF THE INVENTION

Before starting the detailed description, we will explain problems with the plasma etching. As is the same case where an Si wafer is etched, a mask substrate is anisotropically etched by plasma etching, such as reactive ion etching, capable of providing fine pattern. The plasma etching is performed as follows. In the reaction chamber, when an RF (Radio Frequency) voltage is applied, a reactive gas is dissociated into a plasma state. Simultaneously, the RF voltage is applied to a work piece (a mask substrate) set in the reaction chamber, thereby producing the voltage in the surface of the mask. Then, charged particles (electrons or ions) present in the reactive gas plasma are attracted by the voltage, with the result that the surface of the mask is etched physically and chemically. In the plasma etching, the etching rate elevates with an increase of the surface voltage of the work piece.

During the plasma etching process, the amount of electric charge brought by the charged particles (electrons or ions) differs between an etching portion without cover and a non-etching portion covered with an etching resistant film (an etching mask) such as a resist, depending on the materials used in the etching mask. The profile of the difference is shown in FIGS. 3 and 4.

Figure 1:
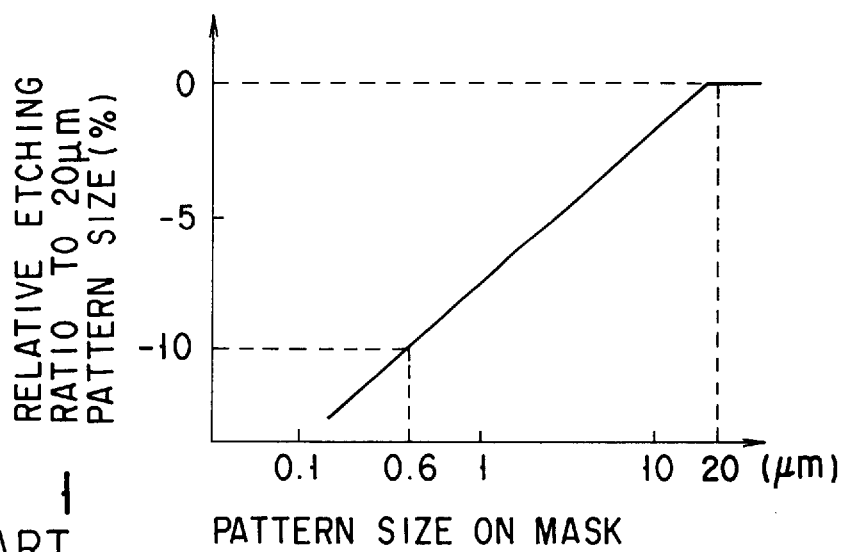
FIG. 1 is a graph illustrating the relationship between the pattern size and the etching rate in prior art.
Figure 2A:
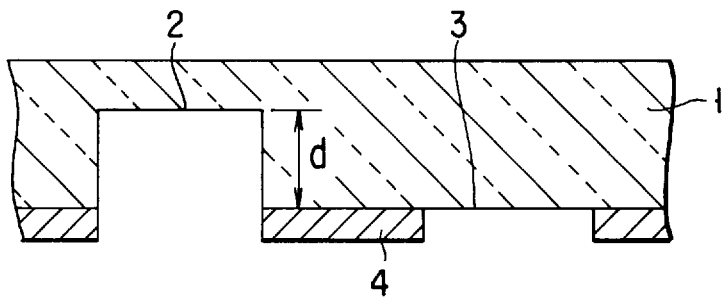
FIG. 2A is a cross sectional view of a representative phase shifting mask of a subtractive shifter type.
Figure 2B:
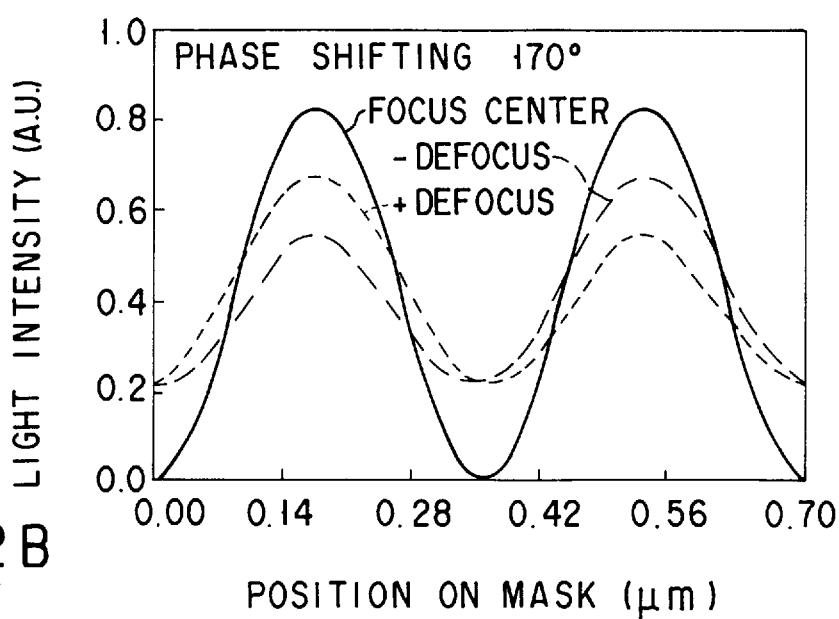
FIG. 2B is a diagram illustrating the relationship between the position on a mask and light intensity when the mask shown in FIG. 2A has a phase shift of 170°, with respect to the cases where the mask is placed in focus or out of focus (the abscissa corresponds to the lateral position on the mask shown in the cross sectional view of FIG. 2A)
Figure 3:
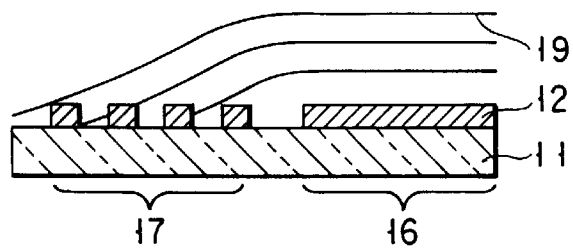
FIGS. 3 and 4 are views illustrating an equipotential surface of the substrate when a mask substrate is placed on the electrode of a plasma etching device.
Figure 4:
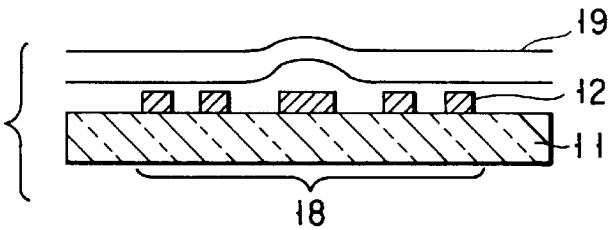

FIG. 3 shows the profile of an equipotential surface 19 formed near the surface of the mask substrate in the case where a region 17 having fine etching patterns is arranged adjacent to a region 16 having a relatively large pattern made of an etching-resistant film. FIG. 4 shows the profile of an equipotential surface of a region 18 in which only fine patterns are arranged. In FIGS. 3 and 4, reference numerals 11 and 12 denote a mask substrate and an etching resistant film, respectively.

As shown in FIG. 3, in the portion near the region 16 in which the relatively large etching-resistant film 12 is provided, a potential distribution is influenced by the electric charge accumulated on the film 12. As a result, the surface voltage of the mask substrate increases. On the other hand, as the lateral distance from the region 16 becomes large, the influence by the charge decreases, reducing the surface voltage of the substrate. As is explained above, the surface voltage of the mask substrate around the relatively large etching-resistant film differs from other portions. Since the etching rate depends on the surface voltage of the mask substrate, the etching rate around the relatively large etching resistant film differs from other portions. On the other hand, in the case of the region in which only fine patterns having almost the same size are arranged as shown in FIG. 4, the amount of charge accumulated on the etching resistant film 12 are almost the same between the fine patterns. Therefore, even if there is a difference in the surface voltage between the patterns but the difference is negligible.

In connection with the phenomena mentioned above, when a phase shifter 17a present near the relatively large etching-resistant film 16' is compared to a phase shifter 17b present far apart from the etching-resistant film 16', the surface voltage of the phase shifter 17a near the film 16' is higher than that of the phase shifter 17b. Hence, the etching rate of the phase shifter 17a is higher than the phase shifter 17b. In this case, if the phase shifter 17b is formed with a desired phase difference, 180°, the phase difference of the phase shifter 17a near the film 16' becomes larger than 180°. As a result, the depth of focus of the phase shifter 17a decreases compared to the phase shifter 17b.

In addition to the influence of the density of mask pattern arrangement, thickness of the mask substrate has an influence on the etching rate. That is, the etching rate differs between the center portion and the peripheral portion of the mask substrate, when the substrate is thick, as will be described below.

Although a mask substrate used in the conventional photomask was a 5-inch square, nowadays a 6-inch square substrate having a larger exposure effective area, has been frequently used. With an increase of the mask substrate in size, the mask substrate is more easily deformed due to its own weight when the substrate is installed in a stepper. As a result, a pattern size of a projected image changes and the distortion of the pattern takes place, reducing the depth of focus at the time of exposure. To lower the occurrence of the deformation, the mask substrate is formed thick in practice.

Assuming that the mask substrate is plane, and has the side length $a$, thickness h, and substrate's own weight P, the deformation ω of the substrate is expressed by the equation below:

$$\omega = \alpha \cdot P \cdot a^4 / (E \cdot h^3) \quad (1)$$

where E is the young's modulus and α is the deformation coefficient.

Accordingly, the ratio of $\omega_1$ to $\omega_2$ which are the deformation of two substrates $h_1$ and $h_2$ different in thickness, is expressed by the following equation:

$$\omega_1/\omega_2 = (h_1/h_2)^2 \quad (2)$$

When the photomask is formed by a conventional method, a thick transparent substrate is employed which is rigid enough to resist the deformation caused by the substrate's own weight when the substrate is installed in the stepper, and a mask pattern is directly formed on the substrate.

Figure 6:
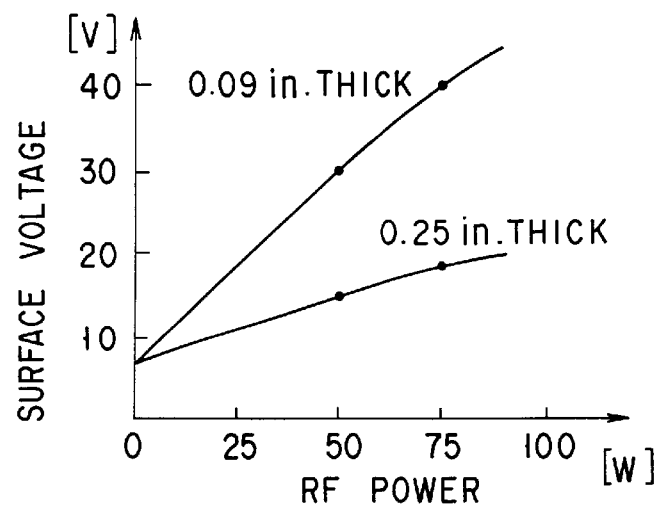
FIG. 6 is a graph showing the relationship between the RF power and the surface voltage of a substrate.

In the plasma etching, the etching rate increases as the surface voltage of the mask substrate increases. However, the RF voltage is attenuated when it passes through an object. For example, when the surface voltage is compared with respect to quartz substrates of 0.25-inch thick and 0.09-inch thick when the same RF power is supplied, the surface voltage of the 0.25-inch quartz substrate is at most a half of that of the 0.09-inch quartz substrate, as shown in FIG. 6.

As described, when the transmittance of the RF voltage decreases with an increase in the thickness of the mask substrate, the force attracting reactive ions (in a plasma of the reactive gas present the upper spatial portion of the mask substrate) toward the surface of the mask substrate decreases. Consequently, the etching rate decreases.

Figure 7:
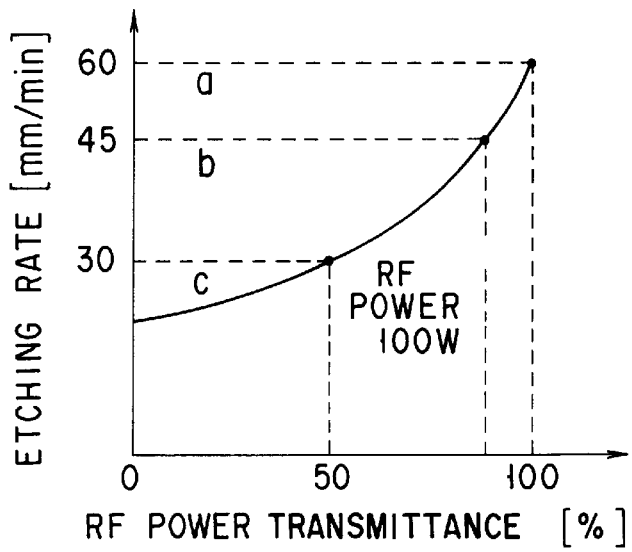
FIG. 7 is a graph showing the relationship between the transmittance of the RF voltage and the etching rate.

FIG. 7 is a graph showing the relationship between the etching rate near the center portion of the mask substrate and transmittance of the RF voltage when the RF voltage is applied to the mask substrate. Symbol $a$ indicates the case where a mask substrate is not present. Symbol b indicates the case where the mask substrate is thin and the transmittance of the RF voltage is high. Symbol c corresponds to the case where the mask substrate is thick and the transmittance of the RF voltage is low.

By contrast, the influence of the RF magnetic field formed around the mask substrate near the peripheral portion of the mask substrate is larger, the etching rate of the peripheral portion is rarely influenced by the thickness of the mask substrate, compared to the center portion thereof.

The difference in etching rate between the center portion and the peripheral portion of the mask substrate is not a significant problem when the mask substrate is thin, as mentioned above, but a significant problem when the mask substrate is thick because there is a big difference in etching rate between the center portion and the peripheral portion. To be more specific, since the surface voltage of the peripheral portion becomes relatively high when the mask substrate is thick, the etching rate relatively increases. As a result, the surface of the mask substrate fails to be etched with a uniform etching amount.

Figure 8:
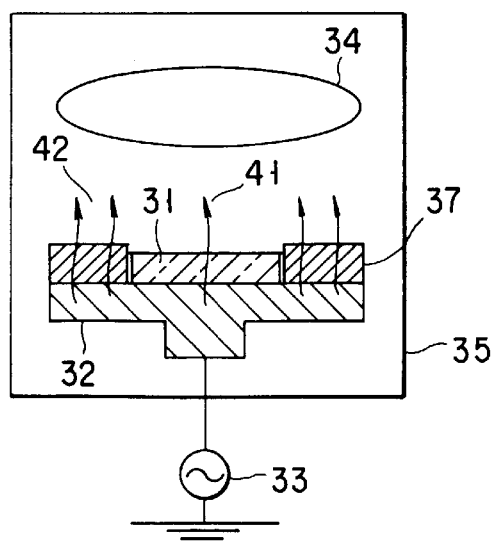
FIG. 8 is a view illustrating how the RF voltage transmits through a mask substrate and the conductive material provided in the peripheral portion in a conventional plasma etching apparatus.

The plasma etching apparatus shown in FIG. 8 has a reaction chamber 35 in which a material 37 having a conductivity higher than the mask substrate is arranged around a mask substrate 31. Other than a passage 41 which transmits an RF voltage from the rear surface of the mask substrate to the upper surface, a passage 42 for transmitting an RF voltage is present in the peripheral portion. Since the RF voltage is liable to transmit through a high conductive material, the applied RF power converges at the passage 42. For this, the transmittance of the RF voltage passing through the passage 42 becomes larger than 100%, which is the transmittance of the RF voltage passing through no object (mask substrate). As a result, the difference in the surface voltage of the substrate between the center portion and the peripheral portion of the mask substrate further increases. With the increase of the surface voltage, the difference in etching rate between the center portion and the peripheral portion increases. Moreover, entire surface of the mask cannot be etched in a uniform etching amount. As a result, processing will be performed with less accurate dimensions.

As is mentioned above, when the phase shifting mask is processed by the plasma etching, there is a problem in that the resultant phase difference differs between the resultant phase shifter positioned near the center portion and that positioned in the peripheral portion of the mask substrate. The difference is caused by the thickness of the mask substrate.

The present invention has been made in view of the aforementioned problems. An object of the present invention is to provide a plasma etching method for improving the uniformity of the etching rates of the surface of a work piece and for improving the accuracy of the shape obtained by etching when a pattern is formed on the surface of the work piece by plasma etching. In particular, the invention provides a plasma etching method capable of ensuring a uniformity of phase differences of the phase shifters over the surface of the mask substrate when a phase shifting mask is formed.

In the plasma etching, the charged particles present in the reactive gas plasma are attracted to the surface of the work piece by the application of the RF voltage to the work piece. The attracted charged particles are consumed in physical and chemical reactions performed in the etching portion. In a conventional plasma etching, the surface of the etching mask is rarely etched. Thus, a lower amount of the charged particles is consumed in the portion covered with the etching mask pattern than in the portion to be etched (hereinafter, referred to as "etching portion"). As the result, the charged particles are gradually accumulated in the etching portion.

Figure 9:
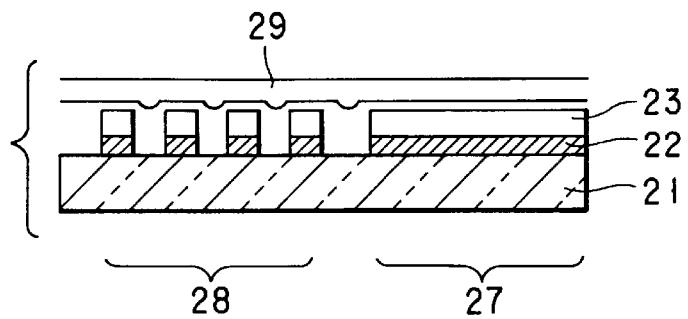
FIG. 9 is a cross sectional view of a mask substrate for explaining an equipotential surface near a mask substrate in the plasma etching according to Embodiment 1 of the present invention.

In the present invention, as shown in FIG. 9, after a film 23 having the same properties as the material of the etching portion, is formed on an etching mask pattern 22 provided on the mask substrate 21, plasma etching is performed. As a result, the film 23 on the etching mask is etched in the same manner as the etching portion. Since the charged particles are consumed in this manner, there is little difference in charge amount between the surface of the etching mask and the etching portion. The equipotential surface 29 becomes flat. There is no difference in surface voltage over the surface of the work piece. As a result, the etching rates of the surface of the work piece become uniform even if large and small etching mask patterns are present. Accordingly, etching sites of the surface of the work piece can be etched with a uniform amount (depth).

The film 23 left on the etching mask is removed by an appropriate method suitable for the type of the film after completion of the plasma etching.

If the phase shifter is formed by the aforementioned plasma etching method in a formation process of the photo mask, the etching for the photo-shifter can be performed with a uniform depth over the surface of the photomask.

Hereinafter, embodiments of the present invention will be explained.

(Embodiment 1)

According to a first aspect of the present invention, the amount of charge imparted on the mask substrate can be equalized by providing a coating film, which is made of a material identical or analogous to the etching portion, on the etching portion of the mask substrate.

Figure 10:
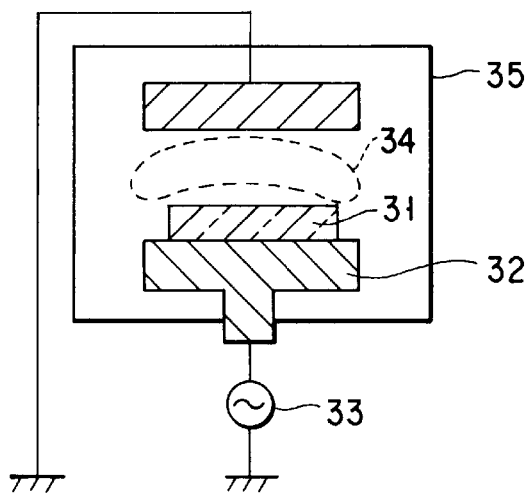
FIG. 10 is a schematic view of a parallel plate RIE apparatus illustrating how to generate a plasma.

In Embodiment 1, a quartz substrate (as a mask substrate) was employed on which a large etching mask as provided. After an SOG film was provided on the etching mask as the coating film having the similar properties to that of the etching portion, plasma etching was carried out. A parallel-plate RIE (reactive ion etching) apparatus used herein is schematically shown in FIG. 10. The apparatus shown in FIG. 10 comprises a mask substrate 31, a conductive stage 32(electrode), and an RF power source 33. Reference numeral 34 denotes a reactive gas plasma generated. Etching was performed under the conditions: RF voltage frequency: 13.56 MHz, RF power: 0.5 W/cm$^2$, reactive gas: a CF$_4$ gas, flow amount of the reactive gas: 15 sccm, and pressure of the reaction chamber: 20 m Torr.

Figure 11A:
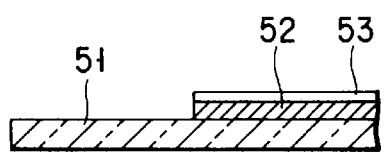
FIGS. 11A and 11B are views for explaining the surface potential of a mask substrate in the plasma etching according to Embodiment 1.
Figure 11B:
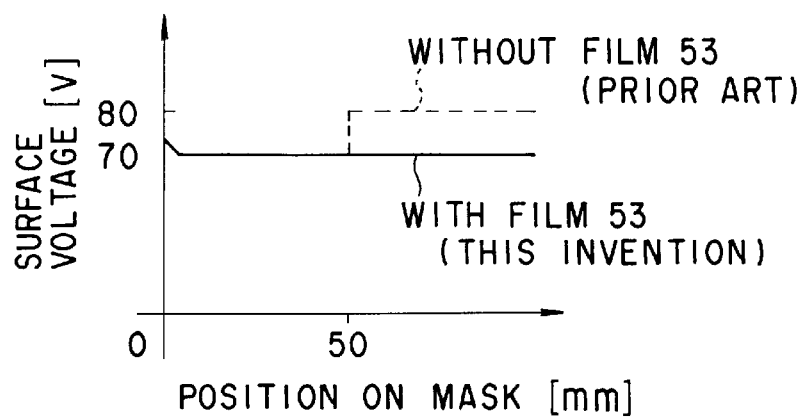

The profile of the surface voltage of the substrate during plasma etching is shown in FIG. 11B. In FIG. 11B, the position on the mask corresponds to the lateral position of the cross sectional view of the mask shown in FIG. 11A. The surface voltage of the substrate exhibits a uniform distribution as indicated by a solid line, with no difference between an etching portion 51 and the surface of the large etching mask 52 coated with the SOG film 53. In FIG. 11B, the data indicated by a broken line was a reference which shows the distribution of the surface voltage of a mask substrate having an etching mask not coated with the SOG film 53.

Hereinbelow, we will explain the case where a phase shift mask of a subtractive shifter type was formed by the plasma etching method according to Embodiment 1 of the present invention. FIGS. 12A to 12I show the steps in succession of manufacturing the subtractive shifter type mask.

First, an opaque film pattern 62 was formed on a quartz substrate 61 (FIG. 12A). The opaque film pattern 62 was formed by sputtering a non-transparent material for an exposure light. A resist was coated on the film and patterned by use of an electron beam writing tool. Using the resist mask thus obtained, the opaque material mentioned above was etched by a wet-etching method. The opaque film used herein was a Cr film.

Next, the resist 63 was coated over the entire surface of the mask substrate (FIG. 12B) to a thickness of 1 μm by means of a spin coater.

Thereafter, an SOG film 66 was coated over the entire surface of the resist and subjected to baking (FIG. 12C). After the baking, the SOG film 66 acquired the same properties as those of the quartz substrate. The thickness of the SOG film 66 was set to a value equal to or more than the etching depth of a quartz substrate to form the phase shifter which will be carried out in a later step. The thickness of the SOG film 66 was actually set to 300 nm in consideration of the etching depth 245 nm (corresponding to a phase difference of 180°) in the subsequent plasma etching step.

On the SOG film 66 thus obtained, a resist 67 was further coated (FIG. 12D) to a thickness of 1 μm by means of a spin coater.

As a next step, the pattern was written by a laser writing tool on the positions of the resist 67 corresponding to alternate openings of the opaque film pattern 62. The resist 67 was developed to form a resist pattern 67a (FIG. 12E). The pattern may be written by an electron beam writing tool in place of the laser writing tool. In this case, however, a conductive film must be coated on an upper layer or a lower layer of the resist 67 to prevent charge-up.

Using the resist pattern 67a as a mask, the SOG film 66 was anisotropically etched until the underlying resist film 63 was exposed (FIG. 12F).

The anisotropic etching was performed by use of the parallel plate RIE apparatus previously shown in FIG. 10, for 10 minutes under the conditions: RF voltage frequency: 13.56 MHz, RF power: 0.5 W/cm$^2$, reactive gas: a CF$_4$ gas, flow amount of the reactive gas: 15 sccm, and pressure of the reaction chamber: 20 m Torr.

Then, the lower resist pattern 63 was patterned with the upper resist pattern 67a and the SOG film pattern 66a used as masks (FIG. 12G). In this case, an anisotropical O$_2$ plasma etching was carried out until the upper resist pattern 67a was removed together with the lower resist 63. In this manner, a pattern was obtained having the lower resist pattern 63a and the SOG film pattern 66a remained over the alternate openings of the opaque film pattern 62.

Using the resultant pattern as an etching mask, the quartz substrate 61 was etched by use of the parallel plate RIE apparatus previously shown in FIG. 10 under the conditions: RF voltage frequency: 13.56 MHz, RF power: 0.5 W/cm$^2$, reactive gas: a CF$_4$ gas, flow amount of the reactive gas: 15 sccm, and pressure of the reaction chamber: 20 m Torr. As a result, a phase shifter 64 was obtained (FIG. 12H) with a desired etching depth of 245 nm (corresponding to a phase difference of 180°).

Thereafter, the resist pattern 63a was removed by the oxidation with a mixed solution of hydrogen peroxide and sulfuric acid. At the same time, the remaining SOG film pattern 66a was removed (FIG. 12I).

Figure 5A:
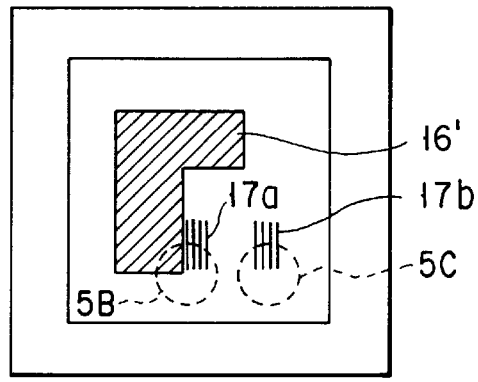
FIGS. 5A to 5E are views for use in explaining problems with plasma etching.
Figure 5B:
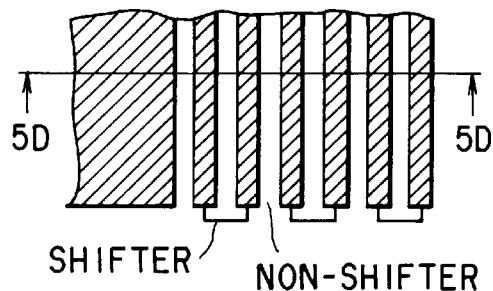
Figure 5C:
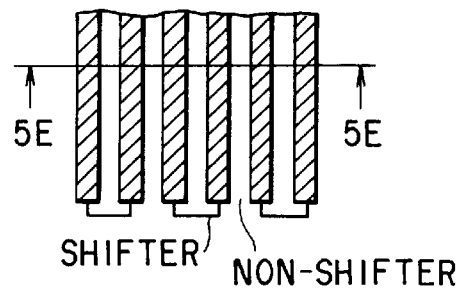
Figure 5D:
Figure 5E:

The distribution of the phase difference was checked with respect to the phase shifting mask formed in the aforementioned steps. Deviation (error) of the phase difference from the desired value fell within 3°. In the case of the phase shifting mask formed by a conventional plasma etching method without using the SOG film, the portion near the large etching mask had a phase error of 10° in the phase difference, compared to the center portion of a line and space pattern positioned far apart from the large etching mask (refer to FIG. 5A).

Using the alternated phase shifting, light exposure was performed by an exposure apparatus (a wavelength of 248 nm, NA=0.5, σ=0.3). As a result, the line and space pattern of 0.15 μm was obtained with 1.7 μm depth of focus over the entire mask face. In the case of phase shifting mask formed by a conventional plasma etching method, the phase shifter near the large etching mask has a large error in phase difference. By the presence of the large phase error, a phase shift effect was canceled out and pattern resolution at the stepped portion was not attained.

Using the same plasma etching method as mentioned above, a phase shifter of the photomask was processed for forming the wiring-layer of a IGbit-DRAM memory cell portion. By use of the photomask, the wiring pattern was obtained with a desired resolution over the entire surface of a chip. In contrast, in the photomask formed by a conventional method, the pattern of a bit/word line of the memory cell portion was not resolved at a part of the stepped portions.

(Embodiment 2)

Hereinbelow, we will explain another case of forming the phase shifting mask of a subtractive shifter type by the plasma etching method according to Embodiment 1 of the present invention.

In FIGS. 13A to 13D, the steps of manufacturing the phase shifting mask are schematically shown. A Cr opaque film pattern 62 was first formed on a mask substrate 61 in the same manner as in Embodiment 1. A resist pattern 63 was formed over alternate openings of the opaque film pattern 62, thereby forming a shift pattern (FIG. 13A). The resist used herein was a Novolak-orthodiazonaphtoquinone series resist. The thickness of the resist was set in such a way that the final thickness of the resist obtained after the writing and developing process is equal to or more than the etching depth of the substrate. The thickness of the resist actually set herein was 1 μm.

The mask substrate with the resist pattern 63 was installed in a sililation apparatus to sililate the surface of the resist. The sililation was performed by permitting vaporized tetramethyldisilane (TMDS) to react with the mask substrate while the mask substrate was being baked at 110° C. As a result, a sililated layer 68 was formed having a thickness within 300 nm on the surface of the resist (FIG. 13B). The thickness of the sililated layer 68 was set to substantially equal to the etching depth of the same when the quartz substrate 61 was etched to a level equivalent to 180° in terms of a phase difference in the step of forming the phase shifter 64 by etching the quartz substrate 61.

The mask substrate having a sililated layer 68 formed on the resist surface thereof was subjected to a plasma etching by means of the parallel-plate RIE apparatus shown in FIG. 10. A desired phase difference provided by a phase shifter was set to 180° and a desired etching depth was set to 245 nm in this embodiment. The phase shifter portion 64 is formed in the mask substrate 61 simultaneously with the sililated layer 68 above the resist film 62 by a single etching step (FIG. 13C).

After the plasma etching, the remaining sililated layer 68 and the resist 63 were removed. As a result, a phase shifting mask was accomplished (FIG. 13D).

Then, the distribution of the phase difference was checked with respect to the entire surface of the phase shifting mask formed in the aforementioned steps. The error in the phase difference was within 3°. In contrast, in the phase shifting mask having no sililated layer above the resist film and formed by a conventional plasma etching method, there was a phase difference of 10° in the portion near the large etching mask, compared to the center portion of a line and space pattern positioned far apart from the large etching mask (refer to FIG. 5A).

Using the phase shifting mask, light exposure was performed by an exposure apparatus (a wavelength of 248 nm, NA=0.5, σ=0.3). As a result, the line and space pattern of 0.15 μm was obtained with 1.7 μm depth of focus over the entire mask face. In the case of phase shifting mask formed by a conventional plasma etching method, the phase shifter near the large etching mask had a large error in phase difference. By the presence of the large phase error, a phase shift effect was canceled out and pattern resolution at the stepped portion was not attained.

Then, a phase shifter of the photomask for the wiring-layer of a IGbit-DRAM memory cell portion was formed by using the same plasma etching method as mentioned above. By use of the photomask, a desired wiring pattern was resolved over the entire surface of a chip. In contrast, in the photomask formed by a conventional method, the pattern of a bit/word line of the memory cell portion was not resolved at a part of the stepped portions.

(Embodiment 3)

Hereinbelow, an embodiment according to a second aspect of the present invention will be explained. In this embodiment, we will explain the case of controlling the etching rate to be uniform over a mask substrate by increasing the transmittance of the RF voltage by controlling the thickness of a mask substrate.

Figure 15:
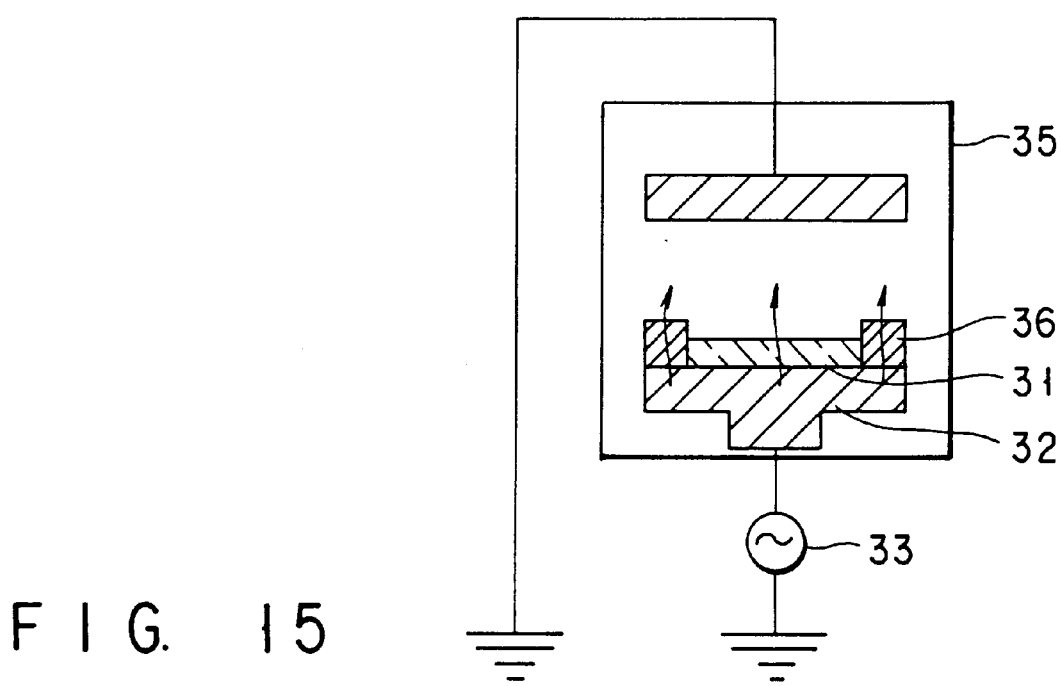
FIG. 15 is a schematic cross sectional view of a plasma etching apparatus in which an insulating shield is provided around the work piece and used for checking the properties shown in FIG. 14.

A quartz substrate 31 was etched by use of a plasma etching apparatus shown in FIG. 15, in which the substrate 31 was surrounded by an insulating shield 36. The relationship between the thickness of a quartz substrate and the surface voltage of the substrate during the plasma etching is shown in FIG. 14. The apparatus shown in FIG. 15 comprises an electrode 32, an RF power source 33 and a reaction chamber 35. The plasma etching was performed under the conditions: reactive gas: a $CF_4$ gas, flow amount of the reactive gas: 15 sccm, and pressure of the reaction chamber: 20 m Torr, RF voltage frequency: 13.56 MHz, RF power: 60, 75 and 100 W. As shown in FIG. 14, when the RF powers of 60, 75 and 100 W were applied, the surface voltages of the 6.4 mm-thick quartz substrate were about 15, 20, and 30V, respectively. On the other hand, the surface voltages of the 1 mm-thick quartz substrate increased to about 60, 80 and 120V, respectively. Since the RF voltage is less attenuated after passing through the quartz substrate by reducing the thickness of the quartz substrate to 1 mm, the RF power initially applied to the substrate reached the surface of the substrate without attenuation, increasing the surface voltage of the substrate.

Figure 16:
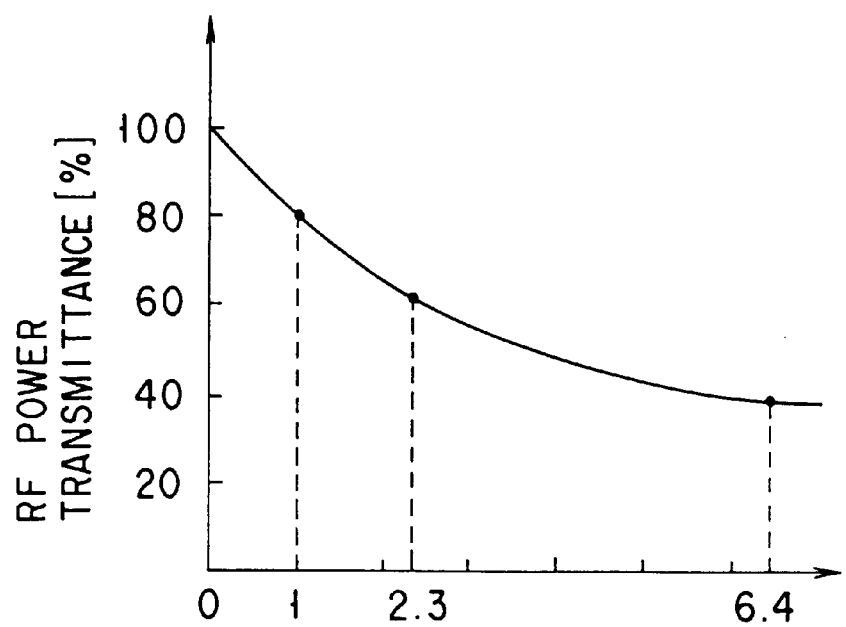
FIG. 16 is a graph showing the relationship between the thickness of a substrate and the RF power transmittance.

When the data obtained above was processed, the relationship between the thickness of the quartz substrate and the transmission of the RF voltage was obtained as shown in FIG. 16. It is apparent from FIG. 16 that if the quartz substrate is set to a thickness 1 mm or less, the transmittance can be obtained at a level of 80% or more.

As a next step, quartz substrates (6-inch square) different in thickness (1 mm and 6.4 mm) were subjected to a plasma etching. The distribution of the etching rates over the substrate surfaces were measured. The etching was performed under the conditions: reactive gas: a $CF_4$ gas, flow amount of the reactive gas: 15 sccm, and pressure of the reaction chamber: 20 m Torr, RF power: 60 W.

Figure 17:
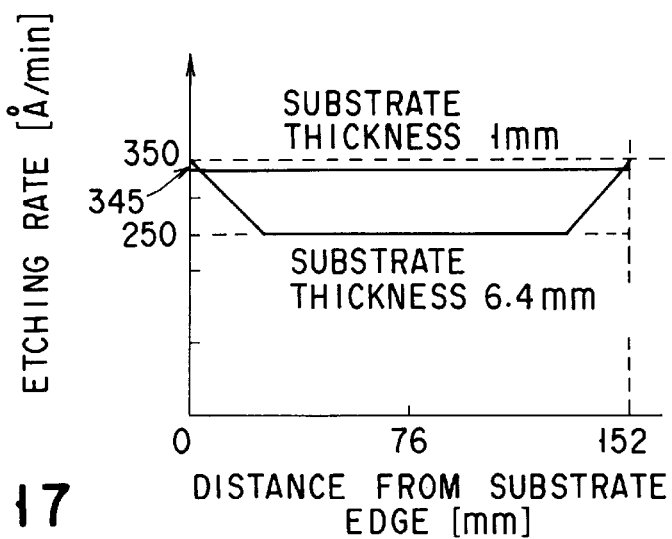
FIG. 17 is a graph showing the relationship between the distance from the peripheral portion of a substrate and the etching rate with respect to substrates different in thickness.

FIG. 17 shows the relationship between the etching rate and the position on the substrate. The distance from the substrate edge is plotted on the abscissa of FIG. 17 and the etching rate on the ordinate. In the case of a 152 mm-square and 6.4 mm-thick quartz substrate used in a conventional photomask, the etching rate of the peripheral portion of the substrate is larger than that of the center portion, by about 40%. In contrast, in the case of a 1 mm-thick quartz substrate according to the present invention, the difference in etching rate between the center portion and the peripheral portion was decreases to 3% as a result of the etching rate of the center portion of the substrate increases. In this way, uniformity of etching rates over the entire substrate was improved.

As a next step, we will explain the case in which a subtractive shifter type phase shifting mask was formed by the aforementioned plasma etching method. Phase shifters were formed by use of the 6-inch square quartz substrates of 6.4 mm-thick and 1 mm-thick under the same conditions as mentioned above. The steps of manufacturing the subtractive shifter type phase shifting mask are the same as those shown in FIGS. 12A to 12I. The wavelength of the exposure light was 248 nm and a desired etching depth was set to 245 nm.

The 1 mm-thick quartz substrate was etched for 8 minutes and the 6.4 mm-thick quartz substrate was etched for 11 minutes. To prevent the difference in etching depth caused by an unstable etching rate due to the etching apparatus, a monitor pattern was positioned at the center of the mask substrate for monitoring the etching depth. By monitoring the etching depth of the monitor pattern by a profilometer, the etching depth of the center portion was controlled to a desired level.

If the phase shift amount of the center portion of the photomask was set to a desired value 180°, the difference in the phase shift amount between the center portion and the peripheral portion of the substrate was 2.6° in the case of the 1 mm-thick quartz substrate. However, in the case of the 6.4 mm-thick quartz substrate, the difference was 72°.

As a next step, light exposure was carried out using the photomask thus formed to obtain a line and space pattern.

Figure 18:
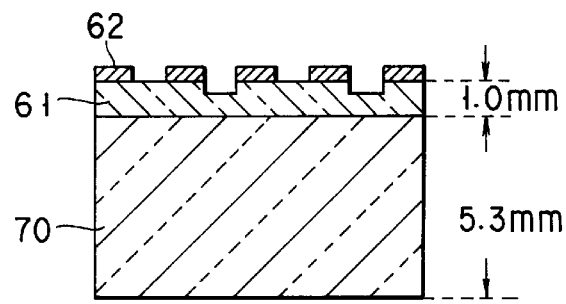
FIG. 18 is a cross sectional view of a photomask according Embodiment 3 of the present invention, in which a transparent supporting plate is provided to the rear surface of a mask substrate.

When a photomask of a 1 mm-thick quartz substrate was directly set in a light exposure apparatus, it was deformed by the weight of the mask substrate, as previously explained. As a result, the depth of focus decreased. For example, if light is applied to a 120 mm square region of the 6-inch square photomask of 1 mm thick, the deformation level of the substrate was approximately 0.58 $\mu$m in the light exposure region. As a result, the depth of focus decreased by the amount corresponding to the deformation level. To suppress the deformation, a 5.3 mm-thick transparent supporting plate (quartz) was bonded to the 1 mm-thick quartz substrate. The cross sectional view of the photomask thus obtained is shown in FIG. 18, in which reference numeral 61 denotes the 1 mm-thick quartz substrate, and reference numerals 62 and 70 represent an opaque film and a reinforcing transparent supporting plate, respectively.

The material for the transparent supporting plate 70 must have a sufficient rigidity against the deformation and must suppress the reflection of the exposure light at the interface with the quartz substrate 61. Assuming that the mask substrate has a side length a, a thickness h, a weight P, the deformation of the substrate ω is expressed by the following equation:

$$\omega = \alpha \cdot P \cdot a^4 / (E \cdot h^3) \qquad (3)$$

where E is the young's modulus and $\alpha$ is the deformation coefficient.

From the aforementioned equation, it is desirable that the supporting plate 70 be made of the material having a $\sigma$ E value ($\sigma$ is a density of the supporting plate 70) equal to or less than that of the quartz substrate 61.

To suppress the reflection at the interface, it is desirable that the supporting plate 70 have an optical coefficient (refraction ratio) n, an extinction coefficient k which differs at most by 1% from those of the quartz substrate 61. When the supporting plate 70 is bonded to the quartz substrate, such a bonding method that it can suppress the reflection sufficiently at the interface, must be employed. The method employed in this embodiment was a method of bonding them with pressure. More specifically, a vacuum bonding method was employed in which both substrates were bonded in a vacuum and then taken out in the atmosphere.

Then, light exposure was performed by use of a light-exposure apparatus (a wavelength of 248 nm, NA=0.5, $\sigma$=0.3), using the photomask thus formed. As a result, the line and space pattern of 0.15 $\mu$m was obtained with 1.7 $\mu$m depth of focus over the entire mask surface. On the other hand, in the case of the same line and space pattern obtained by light exposure using a conventional photomask of a 6.4 mm-thick quartz substrate, the phase shift effect was not effectively obtained in the peripheral portion of the mask substrate. As a result, the pattern was not resolved at the stepped portion of the wafer.

Subsequently, a DRAM chip was obtained by light exposure using a photomask with phase shifter processed by the plasma etching method according to the present invention.

The photomask formed herein was a photomask for the wiring layer of an 1Gbit-DRAM memory cell portion. A phase shifter was provided to a periodical pattern portion according to 0.15 $\mu$m design rule. The pattern portion constitutes a bit/word line of the memory cell. The phase shifter was obtained by etching using the parallel plate plasma etching apparatus. The etching was performed for 8 minutes under the conditions: reactive gas: a $CF_4$ gas, flow amount of the reactive gas: 20 sccm, and pressure of the reaction chamber: 20 m Torr, RF power: 60 W. After the phase shifter was processed, a transparent quartz supporting plate of 5.3 mm thick was bonded to the rear surface of the quartz substrate.

The DRAM chip was obtained by light exposure using the photomask. As a result, the bit/word line pattern of the memory cell portion was resolved with a precise dimensions, contributing to an improvement of the electrical properties of the resultant semiconductor device. In contrast, when a conventional photomask was used, it was difficult to form the peripheral portion of the chip with precise dimensions. The insulating properties deteriorated or electrical conduction took place at the stepped portion. Consequently, uniform electrical properties were not obtained.

(Embodiment 4)

Hereinbelow, an embodiment according to a third aspect of the present invention will be explained. In this embodiment, we will explain the case in which uniformity of the etching rates over the surface of the mask substrate was attained by providing an insulating shield around a mask substrate on a conductive stage.

In the plasma etching device previously shown in FIG. 15, assuming that the passage of RF power is expressed by an equivalent circuit containing capacitors; and a quartz substrate 31 (work piece) has a relative dielectric constant $\epsilon r$, thickness Dr; an insulating shield 36 has a relative dielectric constant $\epsilon s$ and thickness Ds, then, the thickness Dr of the quartz substrate 31 is expressed by $$Dr = (\epsilon r / \epsilon s) \cdot Ds \qquad (4),$$

Figure 19A:
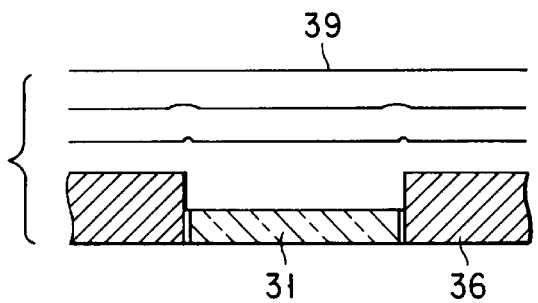
FIG. 19A is an illustration showing the equipotential surface of a mask substrate in the plasma etching according to Embodiment 4 of the present invention.

The RF power transmitted through the quartz substrate 31 is equal to that transmitted through the insulating shield 36. For example, when the insulating shield 36 is formed of 2 mm-thick alumina (relative dielectric constant $\epsilon s$=8.5), the thickness of the quartz substrate (relative dielectric constant=3.8) may be set to about 1 mm. The electric potential distribution near the surface of the quartz substrate is shown in the schematic diagram of FIG. 19A. The plasma etching was performed under the conditions: reactive gas: a $CF_4$ gas, flow amount of the reactive gas: 20 sccm, pressure of the reaction chamber: 20 m Torr, and RF power: 60 W.

When the quartz substrate 31 surrounded with the insulating shield 36 on the conductive stage was subjected to the plasma etching as described above, the RF voltage transmitted from the conductive stage to the upper portion of the reaction chamber by way of the quartz substrate 31 was equal to the RF voltage transmitted from the conductive stage by way of the insulating shield 36. As a result, an equipotential surface 39 became flat and the uniformity of the etching rates over the surface is improved. At the same time, the phase of the exposure light can be controlled well, increasing the depth of focus of the resultant optical image.

Figure 19B:
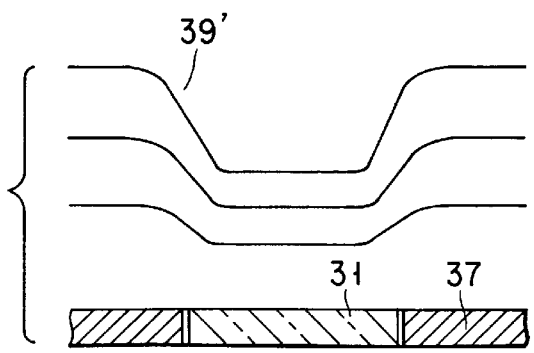
FIG. 19B is an illustration showing the equipotential surface of a mask substrate in the plasma etching according to a conventional method.

For comparison, the profile of the potential distribution near the surface of the quartz substrate 31 in the case of a conventional etching device (corresponding to FIG. 8) using no insulating shield, is schematically shown in the diagram of FIG. 19B. When a highly conductive material 37 is provided around the quartz substrate 31, the voltage around the substrate 31 increases. Hence, an equipotential surface 39 does not become flat.

Hereinbelow, we will explain the case in which the subtractive shifter type phase shifting mask was formed by the plasma etching method mentioned above. The plasma etching apparatus used herein was the same as that previously shown in FIG. 15. As the insulating shield 36, an alumina plate of 2 mm thick (relative dielectric constant 8.5) was used. As the mask substrate 31, a 1 mm-thick quartz substrate was used. The photomask thus obtained was an alternated phase shifting mask. The etching was performed under the conditions: reactive gas: a $CF_4$ gas, flow amount of the reactive gas: 20 sccm, and pressure of the reaction chamber: 20 m Torr, RF power: 60 W. To obtain a shifter etching depth of 245 nm when light of 248 nm wavelength was exposed thereto, the etching time was set to 7.5 minutes.

Under the aforementioned conditions, the phase shifter was obtained by etching. As a result, the phase difference was obtained with a deviation (error) of ±1.8° from a desired phase difference 180° over a 1 mm-thick quartz substrate.

A transparent supporting plate of 5.3 mm thick was bonded to the mask substrate, to make the substrate more rigid. Light exposure was performed using the photomask thus obtained by use of a light exposure apparatus (a wavelength of 248 nm, NA=0.5, σ=0.3). As a result, a line and space pattern of 0.15 μm was formed with the depth of focus 1.9 μm.

The plasma etching method based on the present invention is not limited to the embodiments shown above.

As the coating film to be formed on the resist serving as an etching mask, a $SiO_2$ films (sputtered film) and other films may be used as long as they react with an etching gas in an analogous manner to the material for mask substrate.

The etching mask is not limited to a resist. Organic resins having a hydroxide group, carboxylic acid group, and aldehyde skeleton may be used.

As the agent for sililating the resist, a gaseous sililating agent TMDS was used. Besides TMDS, other gaseous sililating materials may be used which include HMDS (hexamethyldisilazane), DMSDEA (diethylaminodimethylamine), TMSDEA (dietylaminotrimethylsilane), TMSDMA (dimethylaminotrimethylsilane), and DMSDMA (dimethylsilyldimethylamine). Alternatively, sililation treatment may be performed by soaking the resist in a solution of HMCTS (hexamethylcyclotrisilazane), (B)DMADMS (bis-dimethylaminodimethylsilane), (B)DMAMS (bis-dimethylaminomethylsilane) or the like. In the aforementioned embodiments, the etching mask was only sililated. However, the sililated surface of the resist may be oxidized by exposing it to an oxidizing gas atmosphere such as monoxide gas, before the plasma etching of the phase shifter is carried out.

The thickness of the substrate supporting plate and the bonding method of the substrate supporting plate (for controlling the thickness of the mask substrate to attain the uniformity of the etching depth over the mask surface) are not limited to the aforementioned embodiments.

For example, the thickness of the transparent supporting plate is preferred to be set so as to satisfy the following relationship:

when the wavelength of the exposure light is 248 or less, $$d-\omega \times b/a > 1.0 \ \mu m$$

when the wavelength of the exposure light is 248 or more, $$d-\omega \times b/a > 1.5 \ \mu m$$

where d is the depth of focus of the center pattern of the photomask before bonding, ω is the deformation of the photomask after the bonding to transparent supporting plate, a is the side length of the substrate, and b is the size of the effective light exposure area.

The transparent supporting plate may be bonded to the mask substrate by applying a bonding agent having a refractive index closer either to the transparent supporting plate to the entire rear surface of the mask substrate or by applying a bonding agent to the region of a mask not exposed to light, or by binding with a clip.

The material for the insulating shield arranged around the work piece for attaining the uniformity of etching amounts over the entire surface of the etching substrate, is not limited to alumina. For example, any material may be used as long as it has a relative dielectric constant of 3.8 or more such as fluorite.

The plasma etching apparatus for use in the plasma etching method of the present invention is not limited to the parallel plate RIE apparatuses shown in FIG. 15 and FIG. 10. Any plasma etching apparatus may be used as long as the charged particles are attracted to the work piece and the anisotropic etching is carried out in the apparatus.

As an example of the photomask formed by the plasma etching method of the present invention, the subtractive shifter type phase-shifting mask was depicted. However, other types of photomasks can be formed by the present invention. For example, the present invention may be applied to the case in which a phase shifting mask is formed by providing a phase shifter made of a transparent film on a substrate and etching to form a shifter pattern, and to the case in which a phase shifting mask is formed by subjecting the entire light transmitting portion of the quartz substrate of the above-obtained phase shifting mask to wet etching or the anisotropic etching. Furthermore, the method of the present invention may be applied to the formation of not only an alternated phase shifting mask but also the masks of a shifter edge type and half-tone type.

The photomask formed by the method of the present invention may be used together not only with a KrF excimer laser light source (wavelength 248 nm) used in the aforementioned embodiments, but also with other light sources which emits light of a different wavelength, a g line, an I line an ArF excimer laser, or the like.

The plasma etching method is not limited to etching of a mask substrate such as a quartz substrate. The plasma etching method may be applied to a semiconductor substrate such as a Si wafer and to a liquid crystal substrate.

Now, we will explain Embodiments 5 to 9 according to a fourth aspect of the present invention. In these embodiments, an electrode structure of the plasma etching apparatus is improved.

(Embodiment 5)

FIG. 20 shows a schematic view of the structure of the plasma etching apparatus according to Embodiment 5. In an etching chamber 110, parallel-plate electrodes 111 and 112 are positioned mutually opposed. An upper electrode 111 is grounded. A semiconductor wafer 113 to be etched is mounted on a lower electrode 112, which is connected to an RF power source 115 by way of a matching circuit 114.

A reactive gas is introduced into the chamber 110 by way of a gas inlet and evacuated from a gas outlet. When the RF power is applied between the electrode 111 and 112, a plasma is generated by electrical discharge and etches the wafer 113 anisotropically.

The plasma etching apparatus of the present invention basically has the similar structure to that of the conventional apparatus explained above. However, the structure of the lower electrode portion differs from the conventional one as shown in the cross-sectional view of FIG. 21B taken along the line 21B—21B of FIG. 21A. To describe more specifically, a disk-form quartz substrate 121 serving as an RF attenuation member is provided on the upper center portion of the electrode 112. The wafer 113 is mounted on a quartz plate 121. In the peripheral portion of the electrode 112, a ring form quartz plate 122 having the same height as that of the wafer 113 is provided. The quartz plate 122 prevents the magnetic field from converging to the edge portion of the wafer 113.

By virtue of the presence of the quartz plate 121, the RF power applied to the center surface portion of the electrode 112 can be weakened. Consequently, the etching rate for the center portion decreases compared to that in absence of the quartz plate. However, the etching rate of the center portion is originally higher than that of the peripheral portion in the absence of the quartz plate. As a result, the etching rate distribution over the wafer surface is narrower.

In FIG. 22, the etching rate distribution over the entire wafer surface in the present invention is shown in comparison with the distribution obtained in a conventional apparatus. In the conventional apparatus, there is a significant difference ($E_1$) in etching rate between the center portion (showing a maximum etching rate) and the peripheral portion (showing a minimum etching rate), as indicated by a broken line in FIG. 22. In contrast, in the present invention, the difference in etching rate can be lowered to $E_2$ ($E_2<E_1$) by decreasing the etching rate of the center portion, as indicated by a solid line in FIG. 22. In this manner, the present invention made it possible to prevent a big difference in the etching depth between the etching sites when a large wafer is etched. As a result, the reliability of the semiconductor device can be improved.

(Embodiment 6)

FIGS. 23A to 23C are cross sectional views of the electrode portion of a dry etching apparatus according to Embodiment 6.

In FIG. 23A, a depressed portion 123 is formed at the center portion of the lower electrode 112. In this case, the distance between the electrode 111 and 112 becomes longer at the depressed portion. Due to the longer distance, the RF power applied to the center portion of the electrode 112 is weakened. As a result, the same effects as those of Embodiment 5 can be obtained.

In FIG. 23B, a quartz plate 121 serving as an attenuation member is further added to the depressed portion 123 in addition to the structure of FIG. 23A. In the etching apparatus having such a structure, the effect of the increased distance between the electrodes and the effect of the RF attenuation member work synergistically to weaken the RF power provided to the center portion of the electrode 112. In this case, the same effects as those of Embodiment 5 can be also obtained.

In FIG. 23C, the lower electrode is divided into a disk-form center portion 112a and a ring-form peripheral portion 112b. An RF power source 115a is connected to the disk-form portion 112a by way of a matching circuit 114a and an RF power source 115b is connected to the ring-form portion 112b by way of a matching circuit 114b.

In this case, if the RF power applied to the disk-form portion 112a becomes smaller than that applied to the ring-form portion 112b by controlling the matching circuits 114a and 114b, the same effects as in Embodiment 5 can be obtained. Incidentally, the RF powers applied to the disk-form portion 112a and the ring-form portion 112b can be controlled by the matching circuits 114a and 114b. Therefore, the RF power source 115a and 115b are not independently provided. Instead, a common RF power source may be provided.

Note that the RF power to be applied to the peripheral ring-form portion 112b may be lower than that applied to the center disk-form potion 112a.

(Embodiment 7)

Hereinbelow, Embodiment 7 of the present invention will be explained. This embodiment relates to a method of manufacturing a light exposure mask having a phase shifter.

Figure 24:
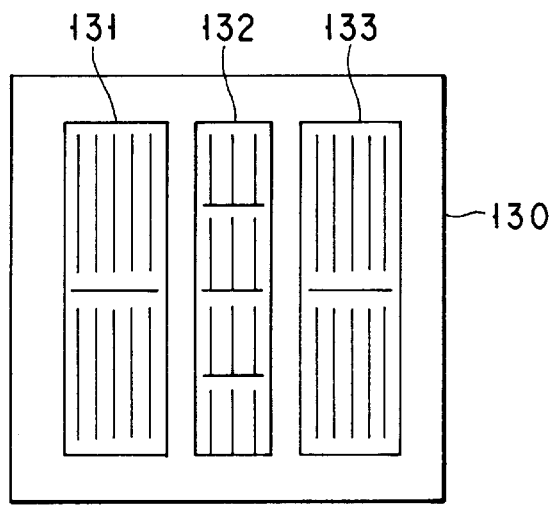
FIG. 24 is a schematic plan view showing a pattern of a phase shifting mask to be used in Embodiment 7 of the present invention.

FIG. 24 schematically shows a phase shifting mask pattern formed in this embodiment. The phase shifting light exposure mask formed herein is a bit-line wiring layer mask for an IGbit DRAM. A mask 130 comprises a transparent substrate (insulating substrate) made of quartz and a Cr opaque film coated on the substrate. The opaque film has openings.

The pattern formation region of the mask 130 is constituted of regions 131 and 133 (bit wiring of the memory cell portion) having very small-thin patterns and a core region 132 having patterns larger than those of regions 131 and 133, according to a design rule. Pattern size was 0.72 $\mu$m in the regions 131 and 133 and 0.88 $\mu$m in the region 132. Using the mask thus constructed, the phase shifting mask of a dual trench shifter type was formed by a commonly known method.

When the mask as shown in FIG. 24 is formed by etching using a conventional dry etching apparatus, the etching rate differs ascribed to the difference in size of the patterns to be etched, as shown in FIG. 27A.

Figure 25A:
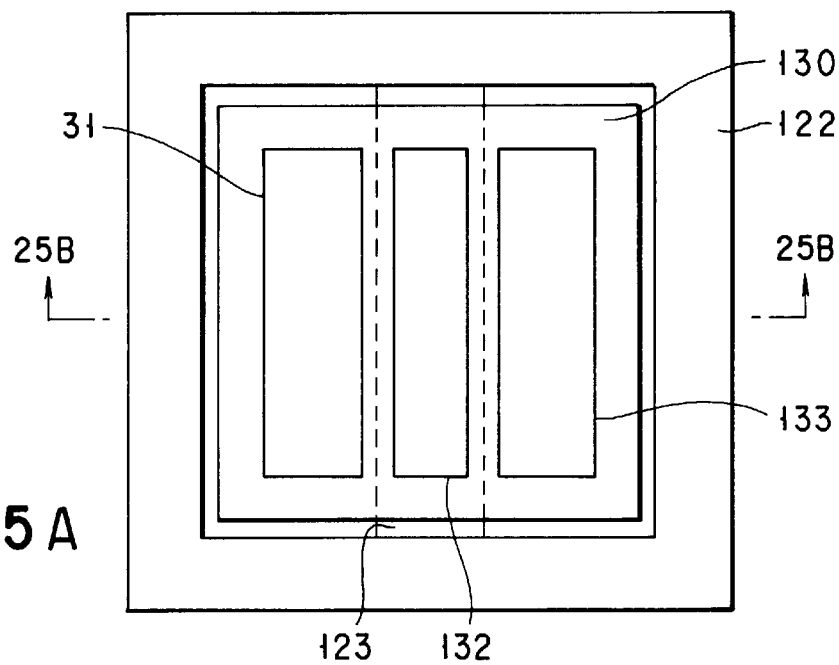
FIG. 25A is a plan view of a construct constituted of a lower electrode of the plasma etching apparatus of Embodiment 7 and a mask substrate shown in FIG. 24 mounted thereon.
Figure 25B:
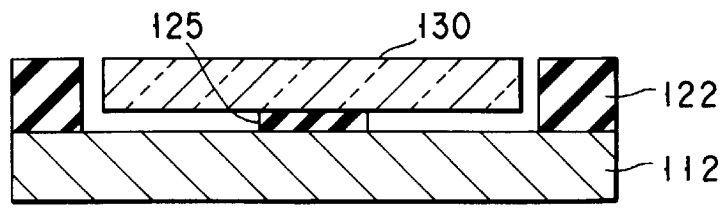
FIG. 25B is a cross sectional view taken along the 25B—25B line of FIG. 25A.

To overcome the difference, the dry etching apparatus (shown in FIG. 20) was used after an improvement (as shown in FIGS. 25A and 25B) was made in the structure of the lower electrode portion of the parallel plate electrode. To be more specific, a quartz plate (RF attenuation plate) 125 having a thickness St (will be described later) was provided to the position corresponding to the region 132 (where etching proceeds at a high rate) between the lower surface of the mask 130 and the electrode 112. Furthermore, a ring-form quartz plate 122 having the same height as that of the mask 130 was provided on the electrode 112 so as to surround the mask 130.

By virtue of the quartz plate 125 placed to a part of the space between the mask 130 and the electrode 112, the RF power applied to the region 132 (in which etching proceeds at a higher rate than the other portion) was attenuated, thereby reducing the etching rate of the region 132. In this way, the difference in etching depth between the region 132 and the region 131 and 133 was successfully diminished.

The thickness St of the quartz plate 125 can be expressed by the following equation if the etching rate of the regions 131 and 133 is Es, the etching rate of the region 132 is E, and the thickness of the mask 130 is Tr, $$St = Tr \cdot n(E/Es).$$

Figure 26A:
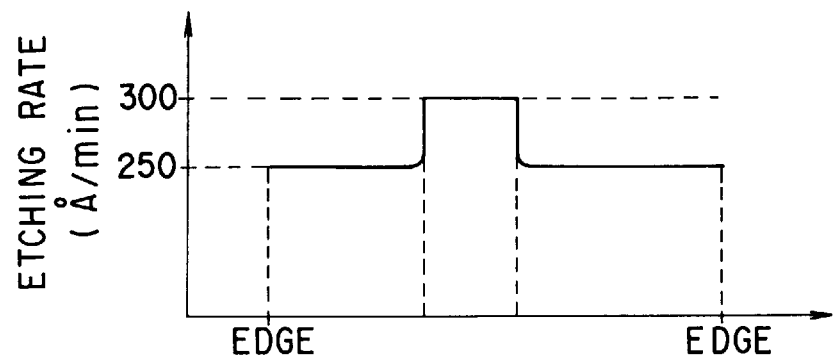
FIG. 26A is a view showing a change in etching rate relative to position on a mask in a conventional plasma etching apparatus which is the same plasma etching apparatus as that of Embodiment 7 except that an RF attenuation plate is not used.

The thickness St was calculated by substituting actually obtained values Es=25 nm/min, E=30 nm/min, and Tr=6.4 mm into the above equation in this embodiment. As a result, St was 1.16 mm. The profile of the RF power applied to the surface of the mask 130 taken along the line 25B—25B of FIG. 25A is shown in FIG. 26B.

Under the conditions, the mask 130 was etched. The resultant etching rates of the cross section taken along the 25B—25B line became uniform as shown in FIG. 26C.

To describe more specifically, the phase shifter portion of the mask 130 (shown in FIGS. 25A and 25B) was selectively etched by the plasma etching apparatus having substantially the same structure as that shown in FIG. 20 for 10 minutes. The resist was finally removed by an SH processing from the entire construct.

Thereafter, the etching depth (in terms of phase accuracy) was measured by use of AFM (Atomic Force Microscope). As a result, the phase accuracy fell within the range of ±2° relative to a desired value 180° in the 10 cm-square pattern area of the 6-inch mask.

According to this embodiment, a light exposure mask having a phase shifter with a very small phase error (deviation) over the surface can be formed with accurate dimensions. It has been very difficult to form a light exposure mask with a large depth of focus in the conventional phase shifting pattern. This is because the etching rate varies depending on the etching sites by the reasons intrinsic to the etching apparatus, depending on the difference in voltage applied to the pattern, and depending on the pattern size, with the result that phase accuracy is low.

Using the light exposure mask providing a phase error of ±2°/10 cm square, obtained in this embodiment, light exposure was performed by a light exposure apparatus (a wavelength of 248 nm, NA=0.5, σ=0.3).

As a result, a line and space pattern of 0.18 μm can be obtained with a 1.4 μm depth of focus over the entire chip surface. In this manner, the wire patterning was resolved with high dimension accuracy over the chip surface, with the result that the electrical properties of the semiconductor device was successfully improved.

In the description above, a quartz plate 125 was disposed according to the size of each pattern region of the mask. Furthermore, two types of quartz plates 121 and 125 may disposed as shown in FIG. 27, to correct the difference in etching rate intrinsic to the etching apparatus explained in Embodiments 5 and 6.

As the method of measuring the phase shifting amount of the phase shifter, a profilometer method or an optical phase difference measuring method may be used other than AFM described in this embodiment.

(Embodiment 8)

FIG. 28 is a cross sectional view of an electrode according to Embodiment 8. The mask formed in this Embodiment is the same bit-line wiring layer mask of the IGbit DRAM as that shown in FIG. 24.

In this Embodiment, a lower electrode 112 applying the RF power was partially divided into blocks 141 as shown in FIG. 28. The block(s) 141 was removed from the portion under a region 132 of a mask 130 at which etching proceeds at a high rate. The RF power applied to the region 132 was attenuated by removing the block(s) 141. As a result, the etching rate of the region 132 was successfully reduced. In this manner, the difference in etching rate between the region 132 and regions 131 and 133, at which etching proceeds at a low rate, was diminished, decreasing the difference in etching depth.

The thickness Bt of the block 141 to be removed is expressed by the following equation if the etching rate of the regions 131 and 133 is Es and the etching rate of the region 132 is E, $$Bt = C \cdot n(E/Es)$$

where C is a constant.

The thickness Bt was calculated by substituting actually obtained values Es=25 nm/mm in and E=30 nm/mm in into the equation. As a result, Bt=20 mm was obtained. From this, the RF power applied to the surface of the mask 130 taken along the line 25B—25B of FIG. 25A can be illustrated as shown in FIG. 26B.

When the mask 130 was etched under the aforementioned conditions, uniform etching rate distribution was obtained as shown in FIG. 26C which shows the distribution at the cross section taken along the line 25B—25B of FIG. 25A.

To describe more specific, the phase shifter portion of the mask 130 was selectively etched under the conditions shown in FIG. 28. The etching apparatus used herein was substantially the same as that shown in FIG. 20. Overall etching time was 10 minutes. Finally, the entire resist was removed by the oxidation with a mixed solution of hydrogen peroxide and sulfuric acid.

Thereafter, the etching depth (in terms of phase accuracy) was measured by means of AFM etc. As a result, the phase accuracy fell within the range of ±2° relative to a desired value 180° in a 10 cm square pattern of the 6 inch mask.

According to this embodiment, a light exposure mask with phase shifters having extremely small phase error over the surface can be obtained with high dimension accuracy in the same as in Embodiment 7. Using the light exposure mask having a phase error of ±2°/10 cm square, obtained in this embodiment, light exposure was performed by a light exposure apparatus (a wavelength of 248 nm, NA=0.5, σ=0.3). As a result, a 0.18 μm line and space pattern was obtained with 1.4 μm depth of focus over the entire surface of a 2.5 cm square chip in the same manner as in Embodiment 7. Hence, the wiring pattern was successfully resolved with high dimension accuracy over the entire surface of a chip, improving the electrical properties of a semiconductor device.

(Embodiment 9)

Figure 29A:
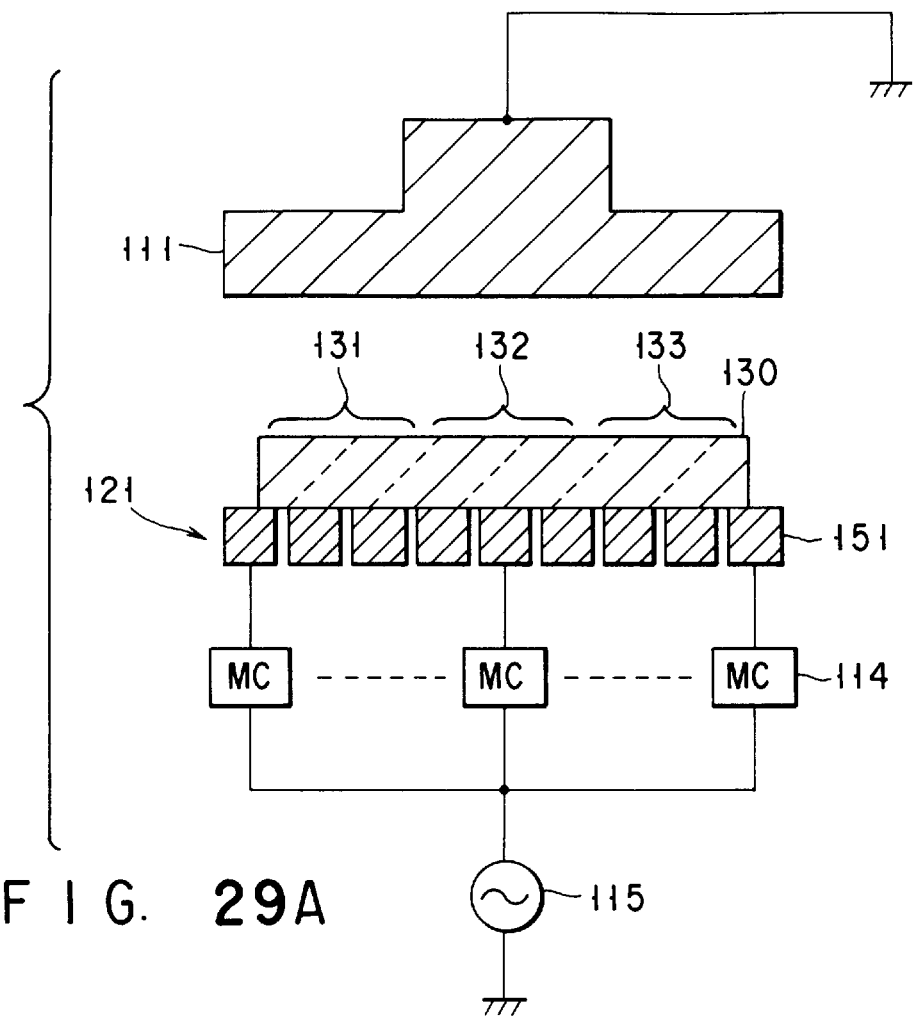
FIG. 29A is a cross sectional view of an electrode structure of a plasma etching apparatus according to Embodiment 9 of the present invention.

FIG. 29A is a cross sectional view of the structure of an electrode according to Embodiment 9 of the present invention. The mask formed in this embodiment is the same bit-line wiring mask of the IGbit DRAM as that shown in FIG. 24.

Figure 30A:
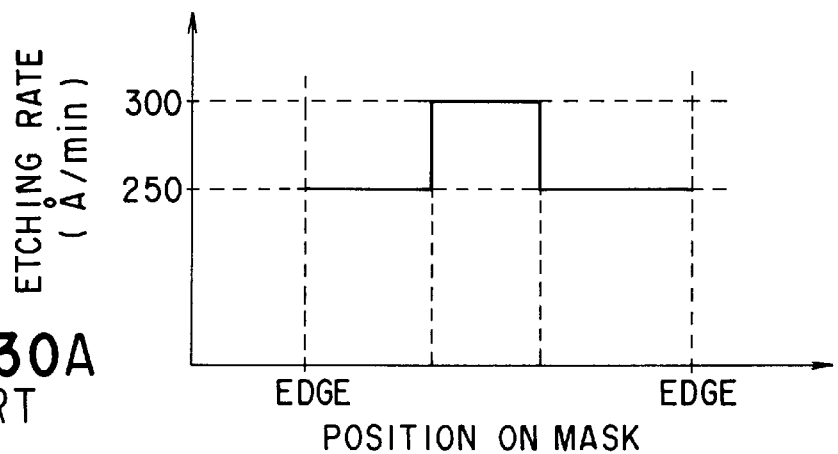
FIG. 30A is a diagram showing a change in etching rate relative to position on a mask in a conventional plasma etching apparatus.

When the mask of FIG. 24 is etched by a conventional dry etching apparatus, the etching rate varies depending on the difference of the pattern size of a work piece, as shown in FIG. 30A.

Then, in this Embodiment, a lower electrode 121 applying the RF power was divided into blocks 151 as shown in FIG. 29A. To each of the blocks 151, an RF power supply line was provided. To each of the RF supply lines, a matching circuit 114 was provided for controlling the RF power. The matching circuit 114 plays a role in reducing the RF power applied to the lower electrode blocks 151 under a region 132 on a mask 130 at which etching proceeds at a high rate. As a result, the etching rate of the region 132 was decreased, reducing the difference in etching depth between the region 132 and the regions 131 and 133 at which etching proceeds at a low rate.

The RF power R1 applied to the electrode block 151 under the region 132 is expressed by the following equation in the region where the etching rate is proportional to the RF power, $$R_1 = Rs \cdot n(Es/E_1).$$

Where Es is the etching rat e of the regions 131 and 133, $E_1$ is the etching rate 132, and Rs is the RF power applied to the regions 131 and 133.

Figure 30B:
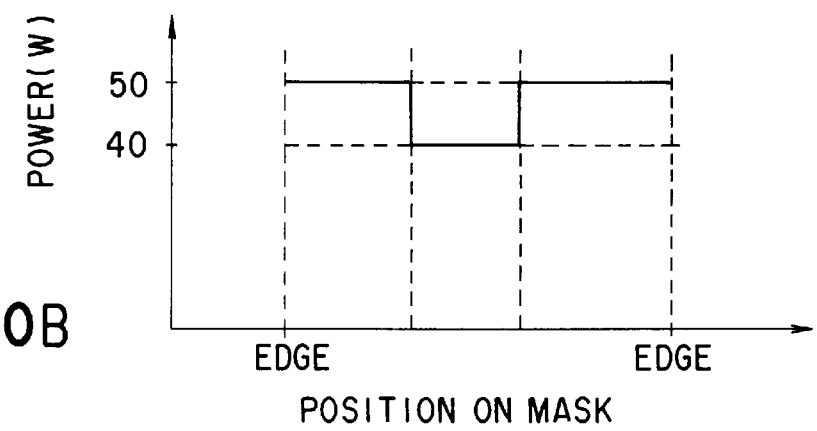
FIG. 30B is a diagram showing the RF power in accordance with positions on a mask in Embodiment 9.

The RF power $R_1$ was calculated by substituting actually obtained values Es=25 nm/min, $E_1$=30 nm/min, and Rs=50 W into the equation. As a result, $R_1$=40 W was obtained. From this, the RF power applied to the surface of the mask 130 taken along the line 25B—25B of FIG. 25A can be illustrated as shown in FIG. 30B.

Figure 30C:
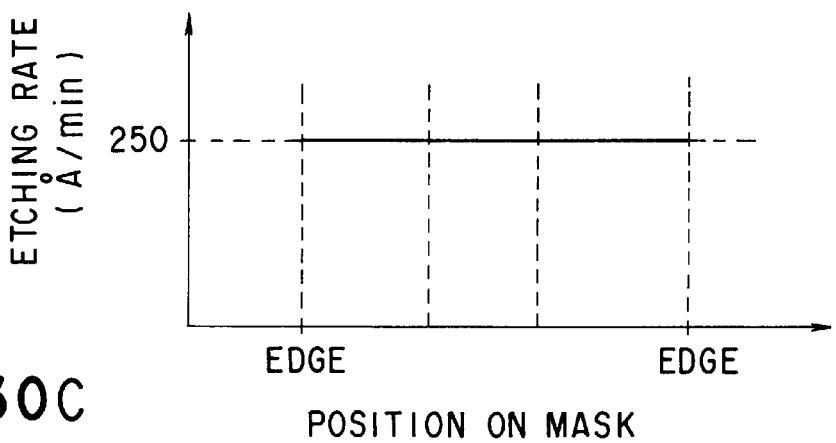
FIG. 30C is a diagram showing a change in etching rate relative to position on the mask in Embodiment 9.

When the mask 130 was etched under the conditions, uniform etching rate distribution was obtained as shown in FIG. 30C which shows the distribution at the cross section taken along the line 25B—25B of FIG. 25A.

Figure 29B:
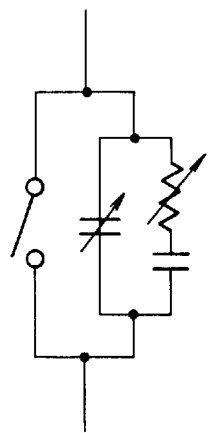
FIG. 29B is a detailed circuit of MC 114 shown in FIG. 29A.

To describe more specific, the phase shifter portion of the mask 130 was selectively etched under the conditions shown in FIG. 29B. The etching apparatus used herein was substantially the same as that shown in FIG. 20. Overall etching time was 10 minutes. Finally, the entire resist was removed by SH treatment.

Thereafter, the etching depth was measured in terms of phase accuracy by means of AFM etc. As a result, the phase accuracy fell within the range of ±1° relative to a desired value of 180° in a 10 cm square pattern of the 6 inch mask.

According to this embodiment, a light exposure mask with phase shifters having an extremely small phase error can be obtained with high dimension accuracy, in the same as in Embodiment 7. Using the light exposure mask obtained in this embodiment having a phase error of ±1°/10 cm square, light expose was performed by a light exposure apparatus (a wavelength of 248 nm, NA=0.5, σ=0.3). As a result, a 0.18 µm line and space pattern was obtained with 1.4 µm depth of focus over the entire surface of a 2.5 cm square chip. Hence, the wiring pattern was successfully resolved with high dimension accuracy over the entire surface of a chip, improving the electrical properties of a semiconductor device.

Incidentally, in Embodiment 9, the RF power applied to the center portion of the electrode is set to be smaller than that applied to the peripheral portion. If necessary, the RF power may be applied conversely.

The present invention is not limited to embodiments mentioned above. The etching apparatus is not limited to a parallel plate RIE apparatus. A magnetron RIE apparatus, an ECR-RIE apparatus and the like may be used. The position of the quartz plate provided for the RF attenuation is not limited to the space between the lower electrode and the wafer. The quartz plate may be provided to the surface of the upper electrode in the case where parallel plate electrodes are used.

The methods described in Embodiments 7 to 9 are not limited to the processing of the light exposure mask. The methods may be applied to the processing of a diffraction grating formed of an insulating material with an accurate depth. Furthermore, the present invention is not limited to make an alternated phase shifting mask and may be applied to all the light exposure masks having a phase shifter formed by etching a substrate itself. Examples of such light exposure masks include a shifter-edge mask and a dual trench sifter mask.

The pattern to be formed by the present invention is not limited to a pattern for the bit-line wiring layer of an IGbit DRAM described in embodiments. If the etching rate distribution is corrected by providing a plurality of small attenuation plates in consideration of the difference in the etching rate, light exposure masks for other patterns may be obtained with high phase accuracy.

As is described above in detail, according to Embodiments 5 to 9, the present invention can prevent having a difference in etching rate between the center portion and peripheral portion of a work piece such as a semiconductor wafer by applying a smaller RF power to the center portion than the peripheral portion, thereby improving the reliability of the semiconductor device.

Furthermore, according to the present invention, when a plurality of different-size patterns are present on the insulating substrate, as is the case of the shifter pattern of the phase shifting mask of a subtractive shifter type, if a smaller RF power is applied to a larger-size pattern than the small-size pattern, the phase shifting amounts defined by the etching depth can be equalized over the pattern surface. As a result, the resolution and the depth of focus of the light exposure image can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a photomask comprising the steps of:

forming a film made of a material selected from a group consisting of an opaque film, a translucent film, and a resist, on a front surface of a transparent substrate made of quartz and having a thickness less than 1 mm;

selectively etching said film to expose part of said front surface of said transparent substrate;

selectively etching said front surface of said transparent substrate partially exposed, by use of a reactive gas plasma after said transparent substrate is mounted on a stage to which an RF voltage is to be applied, a thickness of said transparent being set so that said RF voltage transmitting throughout said transparent substrate has a transmittance of more than 80%; and bonding a transparent supporting plate to a rear surface of said transparent substrate, said transparent supporting plate having a sufficient rigidity against deformation and suppressing a reflection of an exposure light at an interface with said transparent substrate, after said step of selectively etching said transparent substrate by use of said reactive gas plasma.

2. The method according to claim 1, wherein ρ/E of said supporting plate is equal to or lower than that of said transparent substrate, where ρ is a density and E is Young's modulus.

3. The method according to claim 1, wherein a difference between said transparent supporting plate and said transparent substrate with respect to each of a reflection ratio and an extinction coefficient falls within 1%.

4. A method of manufacturing a photomask comprising the steps of:

forming an etching mask on a transparent substrate;

mounting said transparent substrate on a plurality of divided stage portions, each of which an RF voltage is applied to; and forming a subtractive pattern by selectively etching said transparent substrate by anisotropical etching by use of a reactive gas plasma generated by said RF voltage;

wherein said step of forming a subtractive pattern include a step of applying said RF voltage in smaller value to one of said divided stage portions corresponding to a region of said substrate having a larger size pattern than to another one of said divided stage portions corresponding to another region of said substrate having a smaller size pattern.

* * * * *